(12) United States Patent
Hong et al.

(10) Patent No.: US 11,202,364 B2
(45) Date of Patent: Dec. 14, 2021

(54) ELECTRONIC DEVICE COMPRISING FLEXIBLE PRINTED CIRCUIT BOARD HAVING ARRANGED THEREON PLURALITY OF GROUND WIRING SURROUNDING SIGNAL WIRING

(71) Applicant: SAMSUNG ELECTRONICS CO., LTD., Suwon-si (KR)

(72) Inventors: Eunseok Hong, Suwon-si (KR); Jungje Bang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/258,631

(22) PCT Filed: Jun. 5, 2019

(86) PCT No.: PCT/KR2019/006794
§ 371 (c)(1),
(2) Date: Jan. 7, 2021

(87) PCT Pub. No.: WO2020/013449
PCT Pub. Date: Jan. 16, 2020

(65) Prior Publication Data
US 2021/0274645 A1 Sep. 2, 2021

(30) Foreign Application Priority Data

Jul. 9, 2018 (KR) .......................... 10-2018-0079593

(51) Int. Cl.
*H05K 1/02* (2006.01)
*H05K 1/11* (2006.01)

(52) U.S. Cl.
CPC ......... *H05K 1/0215* (2013.01); *H05K 1/0243* (2013.01); *H05K 1/0277* (2013.01);
(Continued)

(58) Field of Classification Search
CPC .................. H05K 1/0215; H05K 1/0277–0283
See application file for complete search history.

(56) References Cited

U.S. PATENT DOCUMENTS

| 5,808,529 A | 9/1998 | Hamre |
| 6,930,240 B1 | 8/2005 | Giboney et al. |

(Continued)

FOREIGN PATENT DOCUMENTS

| KR | 10-2006-0049043 | 5/2006 |
| KR | 10-2012-0062404 | 6/2012 |

(Continued)

OTHER PUBLICATIONS

International Search Report for PCT/KR2019/006794 dated Sep. 19, 2019, 4 pages.
Written Opinion of the ISA for PCT/KR2019/006794 dated Sep. 19, 2019, 6 pages.
Extended European Search Report dated Jun. 24, 2021 in counterpart European Application No. 19833602.6.

*Primary Examiner* — Jeremy C Norris
(74) *Attorney, Agent, or Firm* — Nixon & Vanderhye, P.C.

(57) ABSTRACT

An electronic device according to various embodiments comprises: a circuit element; a printed circuit board comprising a first connection pad connected to the ground of the electronic device, a second connection pad, and a third connection pad arranged between the first connection pad and the second connection pad and connected to a signal terminal of the circuit element; and a flexible printed circuit board (FPCB) comprising a coupling part connected to the printed circuit board, and a connection part extending from the coupling part, wherein the FPCB comprises first ground wiring connected to the first connection pad and extending from the coupling part to the connection part in an assigned direction, second ground wiring connected to the second connection pad and extending from the coupling part to the connection part in the assigned direction, signal wiring connected to the third connection pad and extending from (Continued)

the coupling part to the connection part in the assigned direction, while being arranged between the first ground wiring and the second ground wiring, and third ground wiring arranged in an opposite direction to the assigned direction so as to be connected, in the coupling part, to the first ground wiring and the second ground wiring and surround the signal wiring. Other various embodiments are possible.

20 Claims, 22 Drawing Sheets

(52) U.S. Cl.
CPC ............ *H05K 1/114* (2013.01); *H05K 1/118* (2013.01); *H05K 2201/041* (2013.01); *H05K 2201/093* (2013.01); *H05K 2201/09327* (2013.01); *H05K 2201/10098* (2013.01)

(56) References Cited

U.S. PATENT DOCUMENTS

| | | |
|---|---|---|
| 7,544,897 B2 | 6/2009 | Kobayashi |
| 8,130,504 B2 | 3/2012 | Muto et al. |
| 9,941,611 B2 | 4/2018 | Chen et al. |
| 9,961,773 B2 | 5/2018 | Choi |
| 2013/0242183 A1 | 9/2013 | Lee |
| 2016/0286649 A1 | 9/2016 | Choi |

FOREIGN PATENT DOCUMENTS

| | | |
|---|---|---|
| KR | 10-1234987 | 2/2013 |
| KR | 10-2016-0114234 | 10/2016 |
| WO | 2016/113942 | 7/2016 |

ELECTRONIC DEVICE COMPRISING FLEXIBLE PRINTED CIRCUIT BOARD HAVING ARRANGED THEREON PLURALITY OF GROUND WIRING SURROUNDING SIGNAL WIRING

CROSS-REFERENCE TO RELATED APPLICATIONS

This application is the U.S. national phase of International Application No. PCT/KR2019/006794 filed Jun. 5, 2019 which designated the U.S. and claims priority to KR Patent Application No. 10-2018-0079593 filed Jul. 9, 2018, the entire contents of each of which are hereby incorporated by reference.

TECHNICAL FIELD

Various embodiments of the disclosure relate to an electronic device including a flexible printed circuit board having arranged a plurality of ground wiring which surround signal wiring.

BACKGROUND ART

With the growth of wireless communication technologies, it is trend that an electronic device (e.g., a communicating electronic device) is being commonly used for daily life, and its resultant contents use is increasing in geometric progression. By a sudden increase of this contents use, a network capacity is reaching the limit gradually. As low latency data communication is demanded, high-speed wireless communication technologies such as a next-generation wireless communication technology (e.g., 5G communication) or wireless gigabit alliance (WIGIG) (e.g., 802.11AD), etc. are being developed.

SUMMARY

A communication device using an ultra high frequency band can include a printed circuit board. In one surface of the printed circuit board, at least one conductive member (e.g., a conductive pattern or conductive patch) used as an antenna radiator can be arranged and, in the other surface, a wireless communication circuit (e.g., an RF module) electrically connected to the conductive member can be mounted. For instance, the electronic device can include an electrical connection member for forwarding a high frequency RF signal from the printed circuit board of the communication device to a main printed circuit board of the electronic device. In recent years, as the electrical connection member, a flexible printed circuit board (FPCB) can be used, and as an electrical connection structure of the printed circuit board of the communication device and the flexible printed circuit board, a solder bonding structure having a relatively excellent access reliability and a relatively low price can be used.

However, in the solder bonding structure, a coupling part (e.g., a soldering possible region) of the printed circuit board and the flexible printed circuit board is arranged such that each pad is exposed out for solder bonding. Owing to this, in the coupling part, a ground shield structure for RF signal wiring may not be applied. Accordingly, in the coupling part, miss matching may occur or an unstable loss of an RF loss may occur.

Various embodiments of the disclosure can provide a communication device having a solder bonding structure, and an electronic device including the same.

According to various embodiments, the disclosure can provide a communication device having a solder bonding structure which improves miss matching between bonding parts and is configured to provide, in a coupling part, a stable loss of an RF loss, and an electronic device including the same.

According to various embodiments, an electronic device can include a circuit element, a printed circuit board including a first connection pad connected to the ground of the electronic device, a second connection pad, and a third connection pad arranged between the first connection pad and the second connection pad and connected to a signal terminal of the circuit element, and a flexible printed circuit board (FPCB) including a coupling part connected to the printed circuit board, and a connection part extending from the coupling part. The flexible printed circuit board can include first ground wiring connected to the first connection pad and extending from the coupling part to the connection part in a specified direction, second ground wiring connected to the second connection pad and extending from the coupling part to the connection part in the specified direction, signal wiring connected to the third connection pad and extending from the coupling part to the connection part in the specified direction, while being arranged between the first ground wiring and the second ground wiring, and third ground wiring arranged in an opposite direction to the specified direction so as to be connected, in the coupling part, to the first ground wiring and the second ground wiring and surround the signal wiring.

According to various embodiments, a flexible printed circuit board can include a flexible printed circuit board layer including a coupling part connected to an external circuit board and a connection part extending from the coupling part. The flexible printed circuit board layer can include first ground wiring extending from the coupling part to the connection part in a specified direction, second ground wiring extending from the coupling part to the connection part in the specified direction, signal wiring extending from the coupling part to the connection part in the specified direction, while being arranged between the first ground wiring and the second ground wiring, and third ground wiring arranged in an opposite direction to the specified direction so as to be connected, in the coupling part, to the first ground wiring and the second ground wiring and surround the signal wiring.

According to various embodiments of the disclosure, a ground shield structure is applied even to a coupling part between a printed circuit board and a flexible printed circuit board, so miss matching is improved and a stable loss of an RF loss is provided, whereby a reliability of a communication device can be guaranteed.

DETAILED DESCRIPTION OF EXAMPLE EMBODIMENTS

Figure 1:
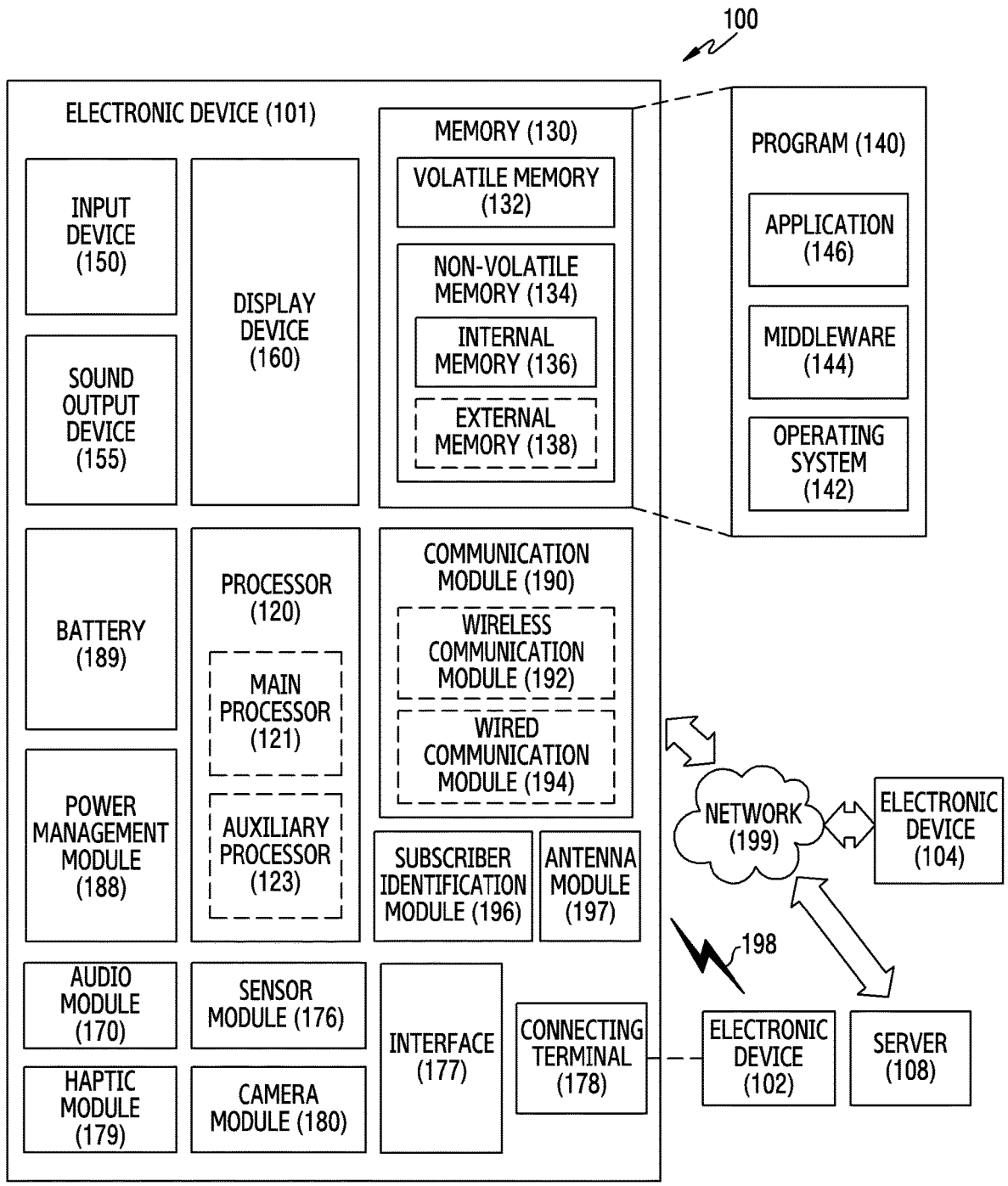
FIG. 1 is a block diagram of an electronic device within a network environment according to various embodiments of the disclosure.

FIG. 1 is a block diagram illustrating an electronic device 101 in a network environment 100 according to various embodiments.

Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module(SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101. The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., PCB). According to an embodiment, the antenna module 197 may include a plurality of antennas. In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2A:
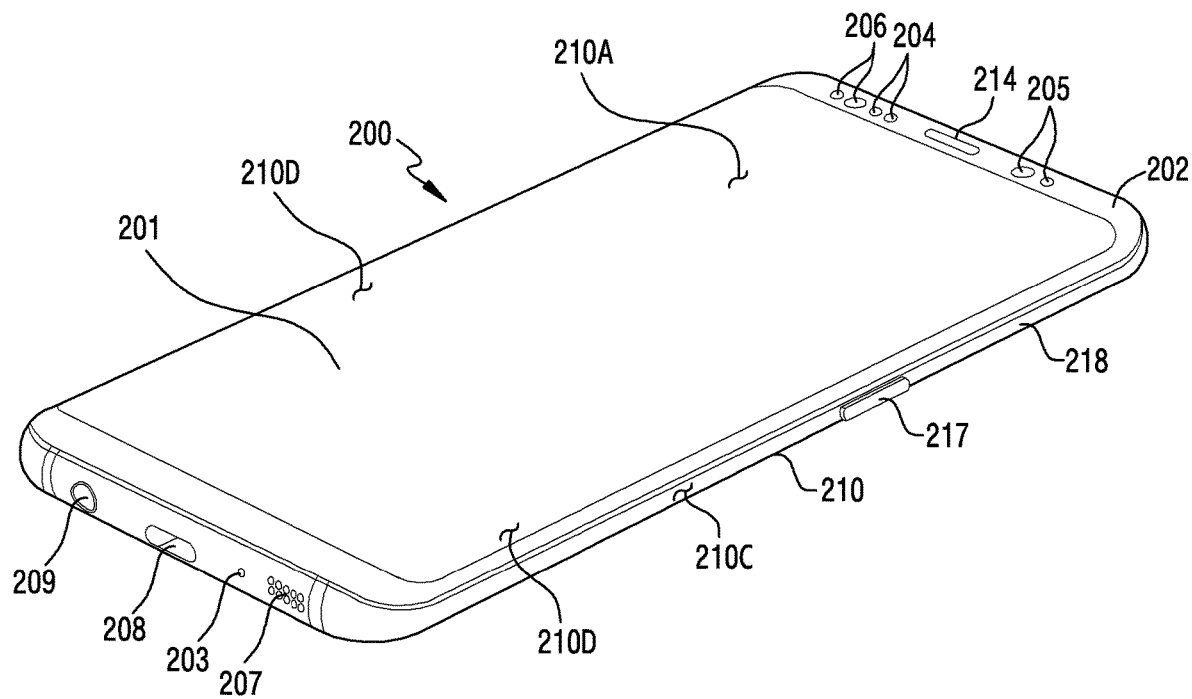
FIG. 2A is a perspective view of a mobile electronic device according to various embodiments of the disclosure.
Figure 2B:
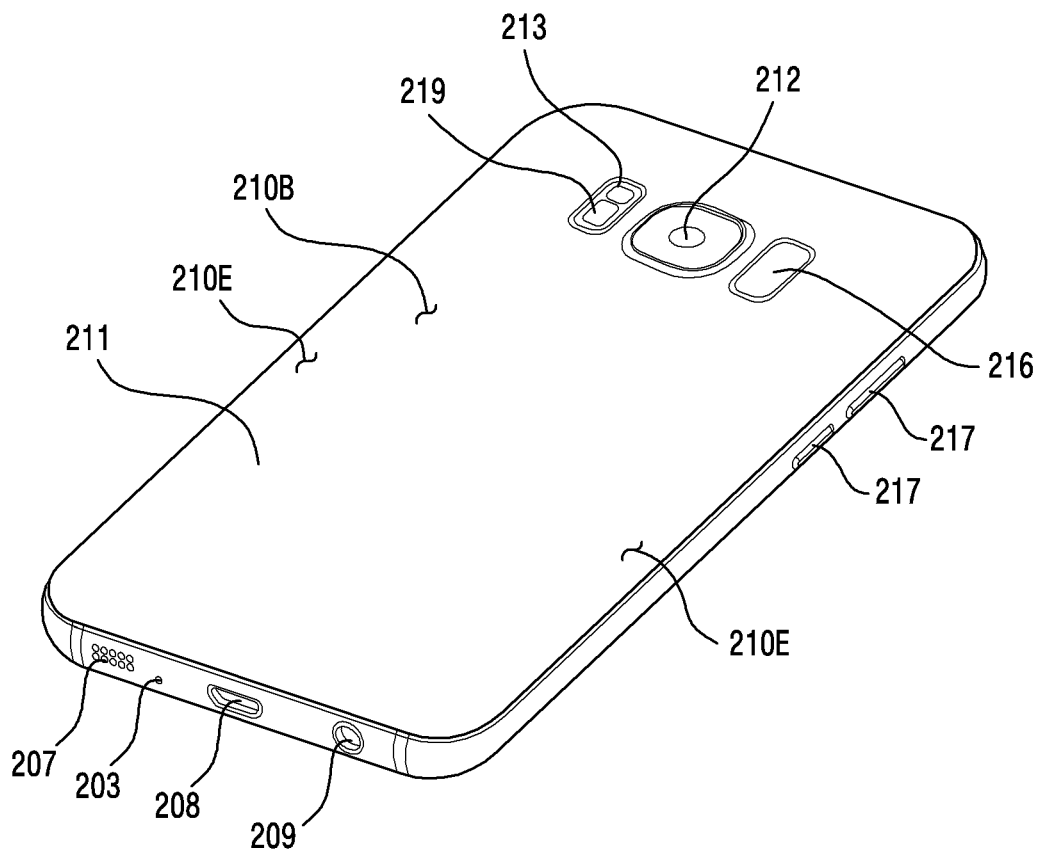
FIG. 2B is a rear perspective view of the electronic device of FIG. 2A according to various embodiments of the disclosure.

FIG. 2A is a front perspective view of a mobile electronic device 200 according to various embodiments of the disclosure. FIG. 2B is a rear perspective view of the mobile electronic device 200 of FIG. 2A according to various embodiments of the disclosure.

Referring to FIG. 2A and FIG. 2B, the mobile electronic device 200 of an embodiment can include a housing 210 which includes a first surface (or front surface) 210A, a second surface (or rear surface) 210B, and a side surface 210C surrounding a space between the first surface 210A and the second surface 210B. In another embodiment (not shown), the housing can denote a structure forming a part of the first surface 210A, the second surface 210B, and the side surface 210C, of FIG. 2A as well. According to an embodiment, the first surface 210A can be formed by a front plate 202 (e.g., a glass plate including various coating layers, or a polymer plate) whose at least part is substantially transparent. The second surface 210B can be formed by a substantially opaque back plate 211. The back plate 211 can be formed of, for example, a coated or colored glass, a ceramic, polymer, a metal (e.g., aluminum, a steel type stainless (STS) or magnesium), or a combination of at least two of the materials. The side surface 210C can be formed by a side bezel structure (or "side member") 218 which is combined with the front plate 202 and the back plate 211 and includes a metal and/or polymer. In some embodiment, the back plate 211 and the side bezel structure 218 can be formed integrally and include the same material (e.g., a metal material such as aluminum).

In an illustrated embodiment, the front plate 202 can include, at both ends of a long edge of the front plate 202, two first regions 210D which are bent from the first surface 210A toward the back plate 211 and are extended seamlessly. In an illustrated embodiment (referring to FIG. 2B), the back plate 211 can include, at both ends of the long edge, two second regions 210E which are bent from the second surface 210B toward the front plate 202 and are extended seamlessly. In some embodiment, the front plate 202 (or the back plate 211) can include only one of the first regions 210D (or the second regions 210E). In another embodiment, some of the first regions 210D or the second regions 210E may not be included. In the embodiments, when viewing from the side of the electronic device 200, the side bezel structure 218 can have a first thickness (or width) at a side not including the first region 210D or the second region 210E, and have a second thickness thinner than the first thickness at a side including the first region 210D or the second region 210E.

In an embodiment, the electronic device 200 can include at least one or more of a display 201, audio modules 203, 207 and 214, sensor modules 204, 216 and 219, camera modules 205, 212 and 213, a key input device 217, a light emitting element 206, and connector holes 208 and 209. In some embodiment, the electronic device 200 can omit at least one (e.g., the key input device 217 or the light emitting element 206) of components or additionally include another component.

The display 201 can be, for example, exposed through a significant portion of the front plate 202. In some embodiment, at least part of the display 201 can be exposed through the first surface 210A and the front plate 202 which forms the first region 210D of the side surface 210C. In some embodiment, an edge of the display 201 can be formed commonly identically with an adjacent outer shape of the front plate 202. In another embodiment (not shown), to extend an area in which the display 201 is exposed, an interval between the outer of the display 201 and the outer of the front plate 202 can be formed commonly identically.

In another embodiment (not shown), a recess or opening can be provided in a part of a screen display region of the display 201, and at least one or more of the audio module 214, the sensor module 204, the camera module 205, and the light emitting element 206 which are aligned with the recess or the opening can be included. In another embodiment (not shown), at least one or more of the audio module 214, the sensor module 204, the camera module 205, the fingerprint scanning sensor 216, and the light emitting element 206 can be included in a rear surface of the screen display region of the display 201. In another embodiment (not shown), the display 201 can be combined with, or be arranged adjacently with, a touch sensing circuit, a pressure sensor capable of measuring a touch strength (pressure), and/or a digitizer detecting a magnetic-type stylus pen. In some embodiment, at least part of the sensor modules 204 and 219 and/or at least part of the key input device 217 can be arranged in the first region 210D and/or the second region 210E.

The audio modules 203, 207 and 214 can include a microphone hole 203 and speaker holes 207 and 214. A microphone for obtaining an external sound can be arranged within the microphone hole 203. In some embodiment, a plurality of microphones can be arranged to sense the direction of sound. The speaker holes 207 and 214 can include an external speaker hole 207 and a call receiver hole 214. In some embodiment, the speaker holes 207 and 214 and the microphone hole 203 can be implemented as one hole, or a speaker can be included (e.g., a piezo speaker) without the speaker holes 207 and 214.

The sensor modules 204, 216 and 219 can provide an electric signal or data value corresponding to an operational state of the electronic device 200 or an environmental state external to the electronic device 200. The sensor modules 204, 216 and 219 can, for example, include a first sensor module 204 (e.g., a proximity sensor) and/or a second sensor module (not shown) (e.g., a fingerprint scanning sensor) which are arranged in the first surface 210A of the housing 210, and/or a third sensor module 219 (e.g., an HRM sensor) and/or a fourth sensor module 216 (e.g., a fingerprint scanning sensor) which are arranged in the second surface 210B of the housing 210. The fingerprint scanning sensor can be arranged in the second surface 210B as well as the first surface 210A (e.g., the display 201). The electronic device 200 can further include at least one of sensor modules not shown, for example, a gesture sensor, a gyro sensor, a barometer, a magnetic sensor, an acceleration sensor, a grip sensor, a color sensor, an infrared (IR) sensor, a biometric sensor, a temperature sensor, a humidity sensor, or an illuminance sensor 204.

The camera modules 205, 212 and 213 can include a first camera device 205 arranged in the first surface 210A of the electronic device 200, and a second camera device 212 arranged in the second surface 210B, and/or a flash 213. The camera modules 205 and 212 can include one or a plurality of lenses, an image sensor, and/or an image signal processor. The flash 213 can include, for example, a light emitting diode or a xenon lamp. In some embodiment, two or more lenses (e.g., an infrared camera, and wide-angle and telephoto lenses) and image sensors can be arranged in one surface of the electronic device 200.

The key input device 217 can be arranged in the side surface 210C of the housing 210. In another embodiment, the electronic device 200 may not include some, or all, of the above-mentioned key input devices 217. The key input devices 217 not included can be implemented on the display 201 in another form such as a soft key, etc. In some embodiment, the key input device 217 can include the sensor module 216 arranged in the second surface 210B of the housing 210.

The light emitting element 206 can, for example, be arranged in the first surface 210A of the housing 210. The light emitting element 206 can, for example, provide state information of the electronic device 200 in a light form. In another embodiment, the light emitting element 206 can, for example, provide a light source interacting with an operation of the camera module 205. The light emitting element 206 can include, for example, an LED, an IR LED and a xenon lamp.

The connector holes 208 and 209 can include a first connector hole 208 capable of accepting a connector (for example, a USB connector) for transmitting and/or receiving power and/or data with an external electronic device, and/or a second connector hole (for example, an earphone jack) 209 capable of accepting a connector for transmitting and/or receiving an audio signal with the external electronic device.

Figure 2C:
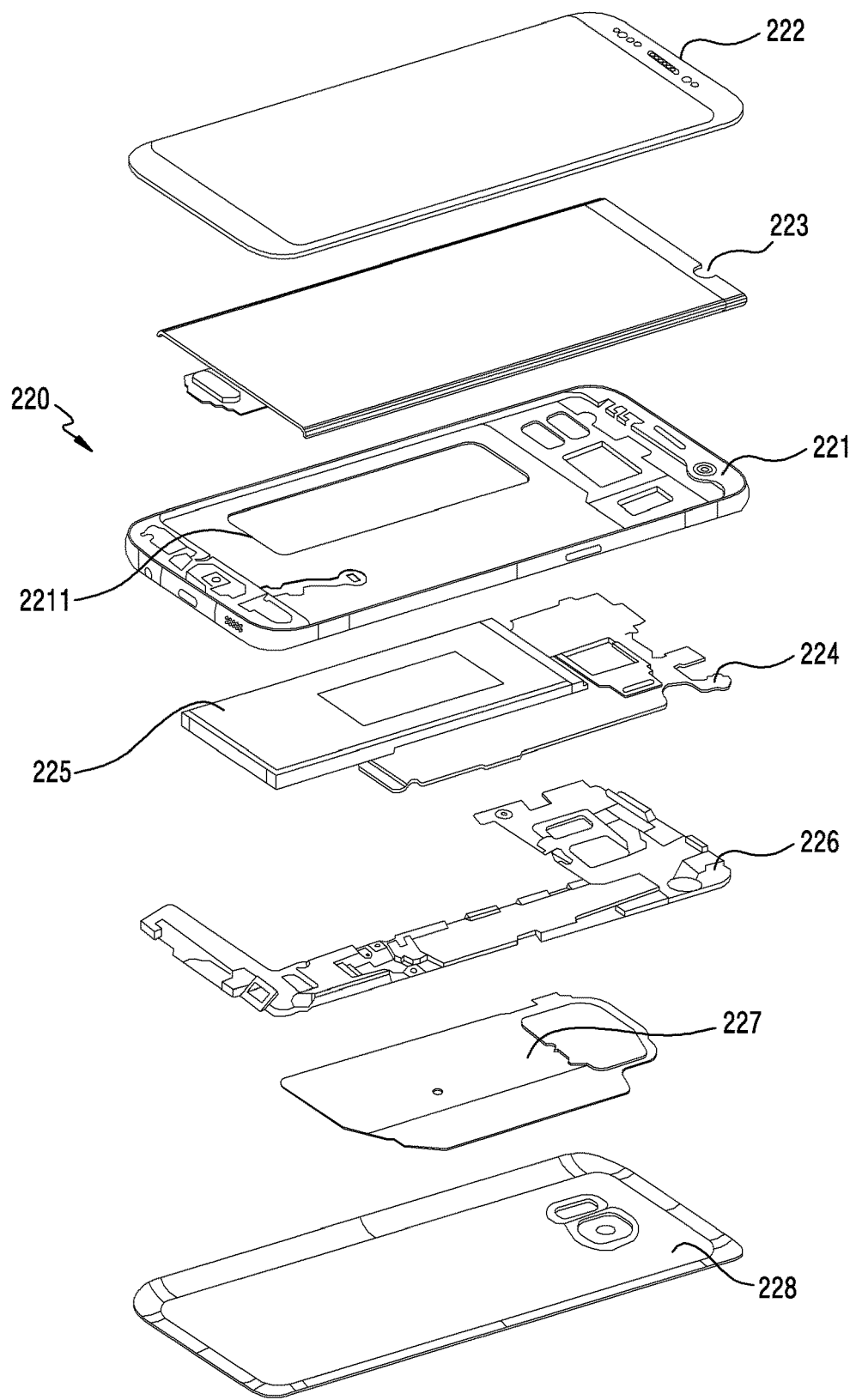
FIG. 2C is an exploded perspective view of an electronic device according to various embodiments of the disclosure.

FIG. 2C is an exploded perspective view of a mobile electronic device of FIG. 2A (e.g., the mobile electronic device 200 of FIG. 2A) according to various embodiments of the disclosure.

Referring to FIG. 2C, the mobile electronic device 220 can include a side bezel structure 221, a first support member 2211 (e.g., a bracket and/or a middle plate), a front plate 222, a display 223, a printed circuit board 224 (e.g., a first printed circuit board), a battery 225, a second support member 226 (e.g., a rear case), an antenna 227, and a back plate 228. In some embodiment, the electronic device 220 can omit at least one (e.g., the first support member 2211 or the second support member 226) of components or additionally include another component. At least one of the components of the electronic device 200 can be identical or similar with at least one of the components of the electronic device 200 of FIG. 2A or FIG. 2B, and a repeated description is omitted below.

The first support member 2211 can be arranged within the electronic device 220 so as to be connected to the side bezel structure 221, or can be formed integrally with the side bezel structure 221. The first support member 2211 can be formed of, for example, metal material and/or non-metal (e.g., polymer) material. The first support member 2211 can be combined, at its one surface, with the display 223, and be combined, at the other surface, with the printed circuit board 224. The printed circuit board 224 may mount a processor, a memory, and/or an interface. The processor can include, for example, one or more of a central processing device, an application processor, a graphic processing device, an image signal processor, a sensor hub processor, or a communication processor.

The memory can include, for example, a volatile memory or a non-volatile memory.

The interface can include, for example, a high definition multimedia interface (HDMI), a universal serial bus (USB) interface, an SD card interface, and/or an audio interface. The interface can, for example, electrically or physically connect the electronic device 220 with an external electronic device, and can include a USB connector, an SD card/MMC connector, or an audio connector.

The battery 225, a device for supplying power to at least one component of the electronic device 220, can include, for example, a non-rechargeable primary cell, a rechargeable secondary cell, or a fuel cell. At least a portion of the battery 225 can, for example, be arranged on the substantially same plane as the printed circuit board 224. The battery 225 can be arranged integrally within the electronic device 220, and can be arranged detachably with the electronic device 220 as well.

The antenna 227 can be arranged between the back plate 228 and the battery 225. The antenna 227 can include, for example, a near field communication (NFC) antenna, a wireless charging antenna, and/or a magnetic secure transmission (MST) antenna. The antenna 227 can, for example, perform short-range communication with an external device, or can wirelessly transmit and/or receive power required for charging. In another embodiment, an antenna structure can be formed by the side bezel structure 221 and/or a part of the first support member 2211 or a combination thereof.

Figure 3A:
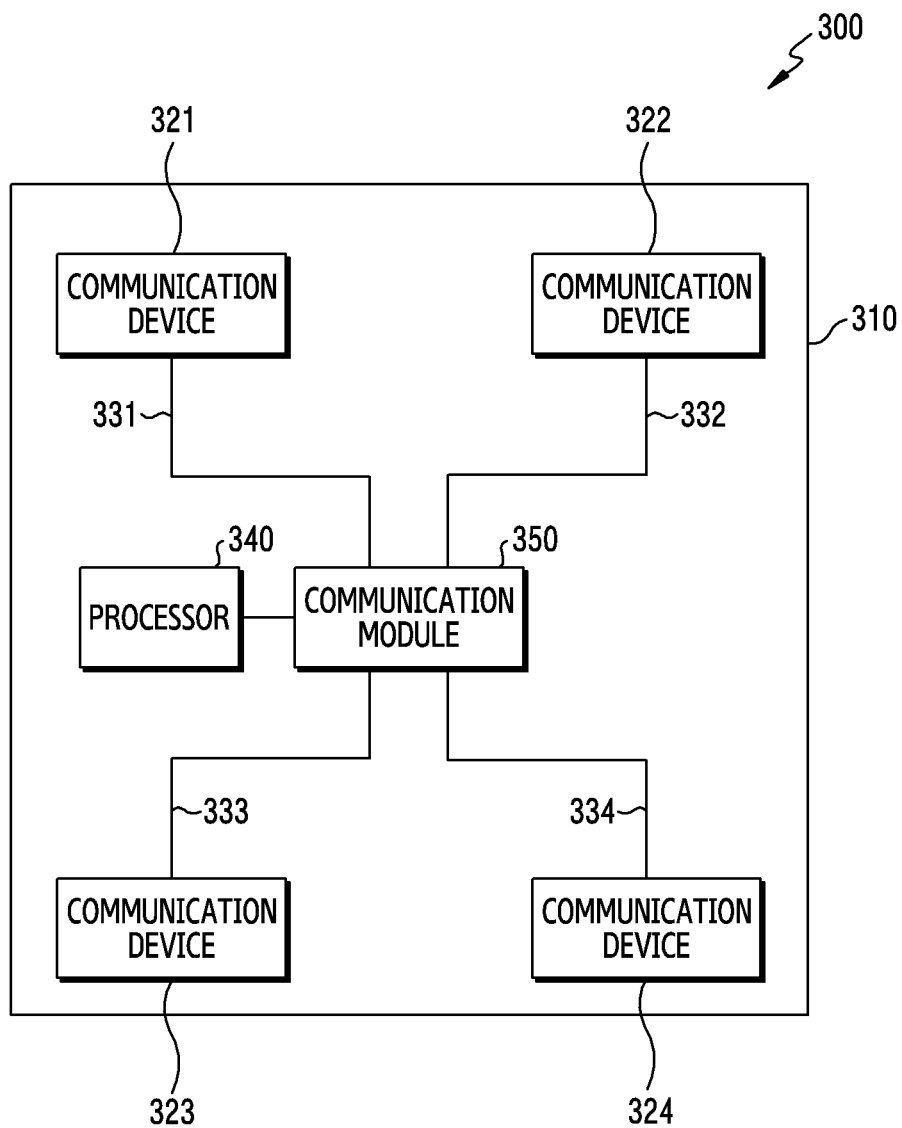
FIG. 3A is a diagram illustrating an example of an electronic device supporting 5G communication according to various embodiments of the disclosure.

FIG. 3A is a diagram illustrating an example of an electronic device 300 which supports 5G communication.

Referring to FIG. 3A, the electronic device 300 can include a housing 310, a processor 340, a communication module 350 (e.g., the communication module 190 of FIG. 1), a first communication device 321, a second communication device 322, a third communication device 323, a fourth communication device 324, a first conductive line 331, a second conductive line 332, a third conductive line 333, or a fourth conductive line 334.

According to an embodiment, the housing 310 can protect other components of the electronic device 300. The housing 310 can include, for example, a front plate, a back plate facing away from the front plate, and a side member (or metal frame) attached to the back plate or formed integrally with the back plate and surrounding a space between the front plate and the back plate.

According to an embodiment, the electronic device 300 can include at least one of the first communication device 321, the second communication device 322, the third communication device 323, or the fourth communication device 324.

According to an embodiment, the first communication device 321, the second communication device 322, the third communication device 323, or the fourth communication device 324 can be located within the housing 310. According to an embodiment, when viewing above the back plate of the electronic device, the first communication device 321 can be arranged at a left upper end of the electronic device 300, and the second communication device 322 can be arranged at a right upper end of the electronic device 300, and the third communication device 323 can be arranged at a left lower end of the electronic device 300, and the fourth communication device 324 can be arranged at a right lower end of the electronic device 300.

According to an embodiment, the processor 340 can include one or more of a central processing unit, an application processor, a graphic processing unit (GPU), an image signal processor of a camera, or a baseband processor (or a communication processor (CP)). According to an embodiment, the processor 340 can be implemented as a system on chip (SoC) or a system in package (SiP).

According to an embodiment, the communication module 350 can be electrically connected to the first communication device 321, the second communication device 322, the third communication device 323 or the fourth communication device 324, by using the first conductive line 331, the second conductive line 332, the third conductive line 333 or the fourth conductive line 334. The communication module 350 can include, for example, a base processor or at least one communication circuit (e.g., an intermediate frequency integrated circuit (IFIC) or a radio frequency integrated circuit (RFIC)). The communication module 350 can include, for example, a baseband processor separates from the processor 340 (e.g., an application processor (AP)). The first conductive line 331, the second conductive line 332, the third conductive line 333 or the fourth conductive line 334 can include, for example, a coaxial cable or an FPCB.

According to an embodiment, the communication module 350 can include a first baseband processor (BP) (not shown) or a second baseband processor (BP) (not shown). The electronic device 300 can further include one or more interfaces for supporting inter chip communication between the first BP (or the second BP) and the processor 340. By using an inter chip interface (i.e., an inter processor communication channel), the processor 340 and the first BP or second BP can transmit and/or receive data.

According to an embodiment, the first BP or the second BP can provide an interface for performing communication with other entities. The first BP can support, for example, wireless communication for a first network (not shown). The second BP can support, for example, wireless communication for a second network (not shown).

According to an embodiment, the first BP or the second BP can form one module with the processor 340. For example, the first BP or the second BP can be integrally formed with the processor 340. For another example, the first BP or the second BP can be arranged within one chip, or be formed in an independent chip form. According to an embodiment, the processor 340 and at least one baseband processor (e.g., the first BP) can be integrally formed within one chip (SoC chip), and another baseband processor (e.g., the second BP) can be formed in an independent chip form.

According to an embodiment, the first network (not shown) or the second network (not shown) can correspond to the network 199 of FIG. 1. According to an embodiment, each of the first network (not shown) and the second network (not shown) can include a 4th generation (4G) network and a 5th generation (5G) network. The 4G network can support, for example, a long-term evolution (LTE) protocol which is regulated in 3GPP. The 5G network can support, for example, a new radio (NR) protocol which is regulated in 3GPP.

Figure 3B:
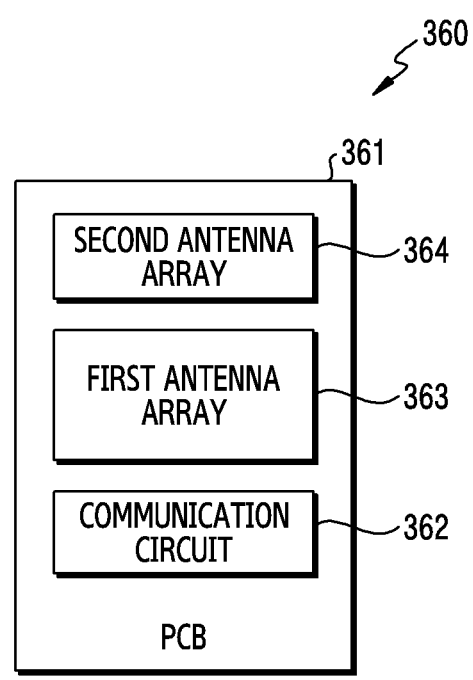
FIG. 3B is a block diagram of a communication device according to various embodiments of the disclosure.

FIG. 3B is a block diagram of a communication device 360 according to an embodiment.

Referring to FIG. 3B, the communication device 360 (e.g., the first communication device 321, second communication device 322, third communication device 323 or fourth communication device 324 of FIG. 3A) can include a communication circuit 362 (e.g., RFIC), a printed circuit board (PCB) 361, a first antenna array 363 or a second antenna array 364.

According to an embodiment, the communication circuit 362, the first antenna array 363 or the second antenna array 364 can be located in the PCB 361. For example, the first antenna array 363 or the second antenna array 364 can be arranged in a first surface of the PCB 361, and the communication circuit 362 can be located in a second surface of the PCB 361. The PCB 361 can include a connector (e.g., a coaxial cable connector or a board to board (B-to-B) connector) for electrically connecting with another PCB (e.g., a PCB having arranged the communication module 350 of FIG. 3A) by using a transmission line (e.g., the first conductive line 331 of FIG. 3A and/or a coaxial cable). The PCB 361 is, for example, connected, by the coaxial cable, with a PCB having arranged the communication module 350 by using the coaxial cable connector. The coaxial cable can be used for forwarding a transmission and reception intermediate frequency (IF) signal or radio frequency (RF) signal. In another example, a power source or other control signals can be forwarded through the B-to-B connector.

According to an embodiment, the first antenna array 363 or the second antenna array 364 can include a plurality of antennas. The antenna can include, for example, a patch antenna, a loop antenna or a dipole antenna. For example, at least some of the plurality of antennas included in the first antenna array 363 can be patch antennas in order to form a beam toward the back plate of the electronic device 300. For another example, at least some of the plurality of antennas included in the second antenna array 364 can be dipole antennas or loop antennas in order to form a beam toward a side member of the electronic device 300.

According to an embodiment, the communication circuit 362 can support at least a partial band (e.g., about 24 GHz to about 30 GHz or about 37 GHz to about 40 GHz) of a band of about 20 GHz to about 100 GHz. According to an embodiment, the communication circuit 362 can up convert or down convert a frequency. For example, the communication circuit 362 included in the communication device 360 (e.g., the first communication device 321 of FIG. 3A) can up convert an IF signal received from a communication module (e.g., the communication module 350 of FIG. 3A) through a conductive line (e.g., the first conductive line 331 of FIG. 3A), into an RF signal. For another example, the communication circuit 362 included in the communication device 360 (e.g., the first communication device 321 of FIG. 3A) can down convert an RF signal (e.g., a millimeter wave signal) received through the first antenna array 363 or the second antenna array 364, into an IF signal, and transmit to the communication module by using the conductive line.

Figure 4A:
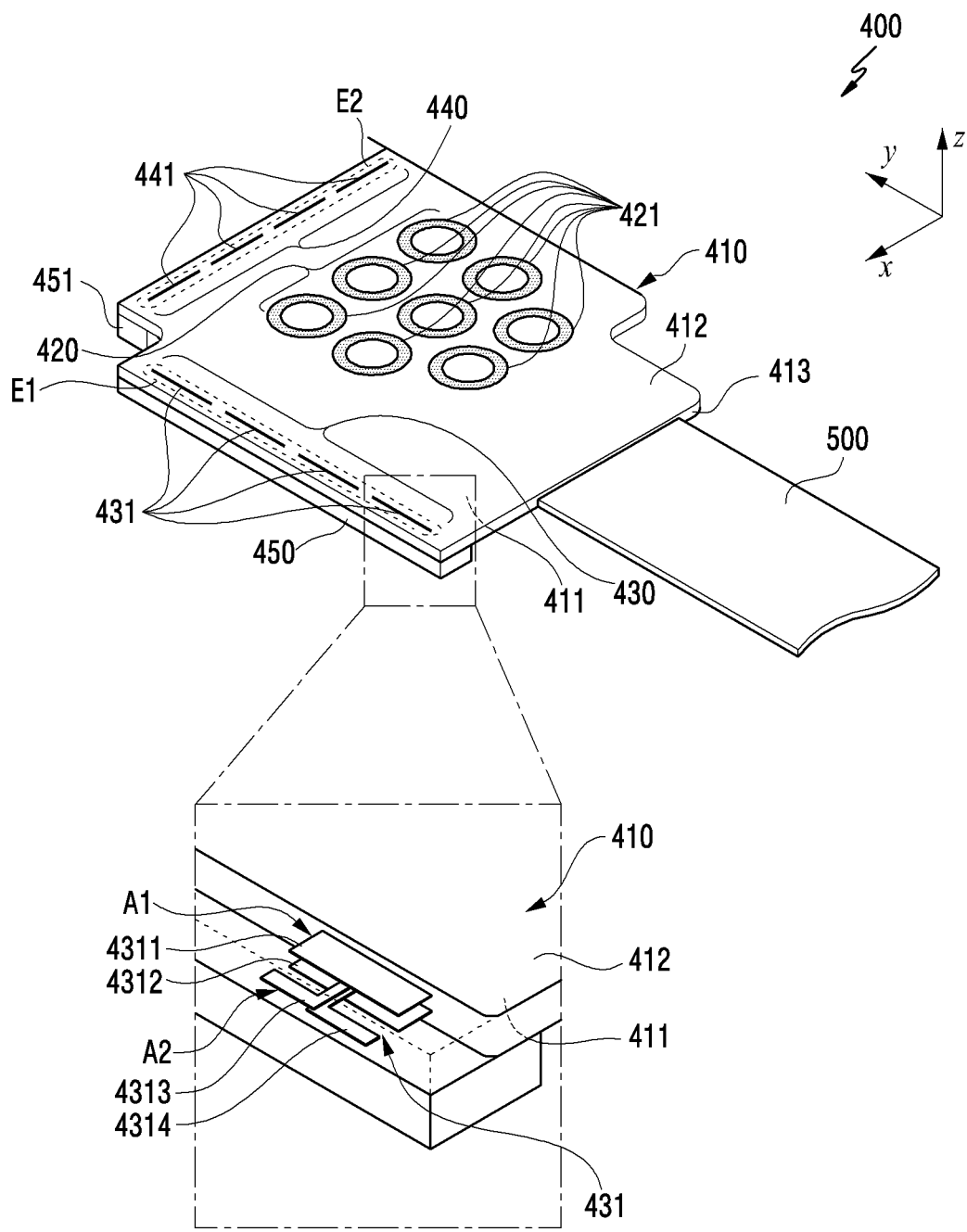
FIG. 4A, FIG. 4B and FIG. 4C are perspective views of a communication device according to various embodiments of the disclosure.
Figure 4B:
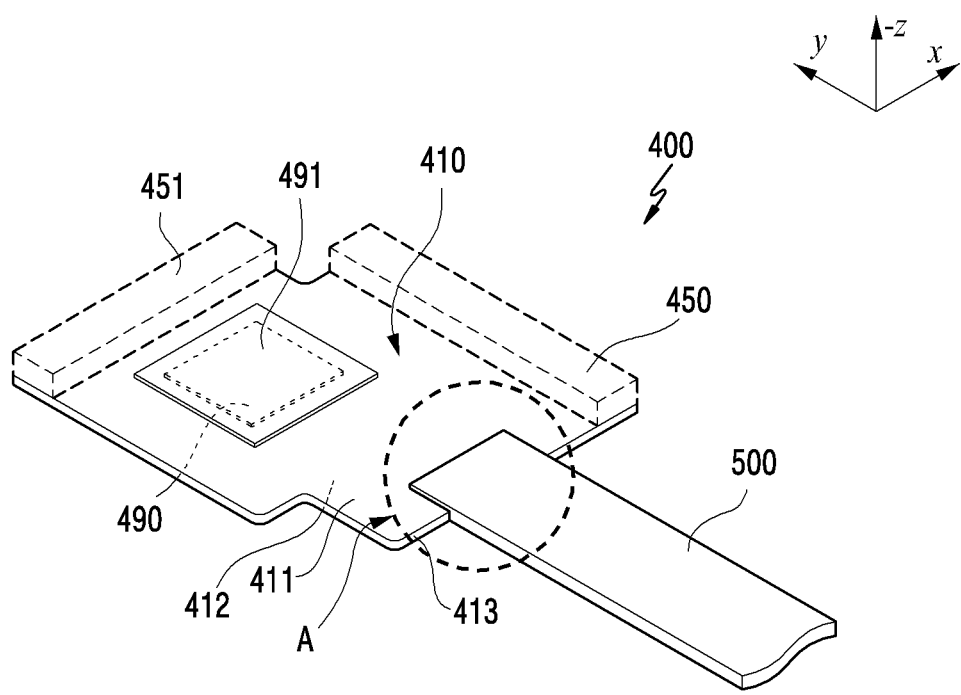
Figure 4C:
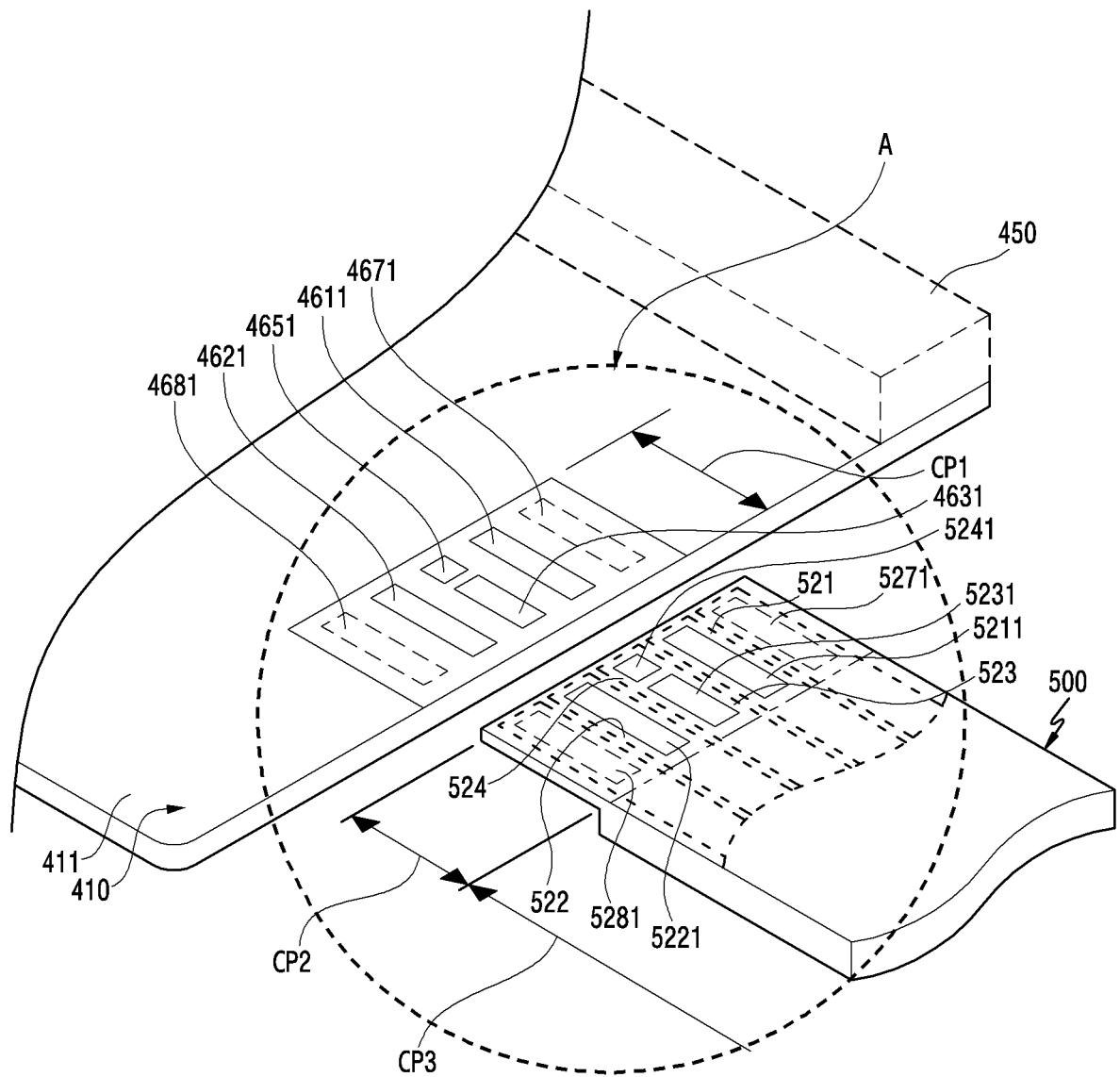

FIG. 4A, FIG. 4B and FIG. 4C are perspective views of a communication device according to various embodiments of the disclosure.

The communication device 400 of FIG. 4A, FIG. 4B and FIG. 4C can be at least in part similar with the communication device 321, 322, 323 and 324 of FIG. 3A or the communication device 360 of FIG. 3B or include other embodiments of the communication device.

Referring to FIG. 4A, FIG. 4B and FIG. 4C, the communication device 400 can include a printed circuit board 410. According to an embodiment, the printed circuit board 410 can include a first substrate surface 411, a second substrate surface 412 facing away from the first substrate surface 411, and a substrate side surface 413 surrounding a space between the first substrate surface 411 and the second substrate surface 412. According to an embodiment, the printed circuit board 410 can be arranged such that the second substrate surface 412 faces a back plate (e.g., the back plate 211 of FIG. 2B) of an electronic device (e.g., the electronic device 200 of FIG. 2B). In another embodiment, the printed circuit board 410 can be arranged such that the second substrate surface 412 of the printed circuit board 410 faces a side member (e.g., the side member 218 of FIG. 2A), or a front plate (e.g., the front plate 202 of FIG. 2A), of the electronic device as well.

According to various embodiments, the communication device 400 can include at least one of a first antenna array 420, a second antenna array 430, or a third antenna array 440, which is arranged in the printed circuit board 410. According to an embodiment, the first antenna array 420 can be arranged such that a beam pattern is formed in a z-axis direction through the second substrate surface 412 of the printed circuit board 410. According to an embodiment, the second antenna array 430 can be arranged such that a beam pattern is formed in an x-axis direction in a first edge region (E1) of the printed circuit board 410. According to an embodiment, the third antenna array 440 can be arranged to be adjacent with the second antenna array 430, and be arranged such that a beam pattern is formed in a y-axis direction in a second edge region (E2) of the printed circuit board 410.

According to various embodiments, the first antenna array 420 can include a plurality of first unit antennas 421 which are arranged at specific intervals in the second substrate surface 412 of the printed circuit board 410. The plurality of first unit antennas 421 can include an antenna element which is formed with a conductive plate (e.g., a metal patch) or a conductive pattern. According to an embodiment, the second antenna array 430 can include a plurality of second unit antennas 431 which are arranged at specific intervals in the first edge region (E1) of the second substrate surface 412 of the printed circuit board 410. According to an embodiment, the third antenna array 440 can include a plurality of third unit antennas 441 which are arranged at specific intervals in the second edge region (E2) of the second substrate surface 412 of the printed circuit board 410.

According to various embodiments, the communication device 400 can include a wireless communication circuit 490 which is mounted in the first substrate surface 411 of the printed circuit board 410 and is electrically connected to the antenna arrays 420, 430 and 440. According to an embodiment, the wireless communication circuit 490 can be configured to transmit and/or receive a signal having a frequency band of a range of about 10 GHz to about 100 GHz through the plurality of antenna arrays 420, 430 and 440.

According to various embodiments, each of the plurality of second unit antennas 431 of the second antenna array 430 can include a first antenna (A1) and a second antenna (A2). According to an embodiment, the first antenna (A1) can include a first antenna element 4311 and a second antenna element 4312. According to an embodiment, when viewing above the second substrate surface 412 of the printed circuit board 410, the first antenna element 4311 and the second antenna element 4312 can be arranged to be spaced a specific interval apart in a position in which at least partial regions are mutually overlapped. According to an embodiment, the wireless communication circuit 490 can transmit and/or receive a vertically polarized wave through the first antenna element 4311 and the second antenna element 4312. According to an embodiment, the first antenna element 4311 and the second antenna element 4312 can be formed in the form of a metal plate or a metal patch. According to an embodiment, the second antenna (A2) can include a third antenna element 4313 and a fourth antenna element 4314. According to an embodiment, the third antenna element 4313 and the fourth antenna element 4314 can be arranged side by side, and be arranged in a space between the first antenna element 4311 and the second antenna element 4312. According to an embodiment, the wireless communication circuit 490 can transmit and/or receive a horizontally polarized wave through the third antenna element 4313 and the fourth antenna element 4314. According to an embodiment, the third antenna element 4313 and the fourth antenna element 4314 can be formed as a dipole radiator of a metal pattern form in the printed circuit board 410. For instance, each of the plurality of third unit antennas 441 of the third antenna array 440 can be formed to have the same structure as the above-described second unit antenna 431, too.

According to various embodiments, the communication device 400 can include a shield can 491 (or shield cover) which is arranged in a scheme of covering the wireless communication circuit 490 mounted in the first substrate surface 411 of the substrate 410 for the sake of noise shield. The communication device 400 can include at least one dielectric material 450 or 451 which is arranged to have a thickness in the first substrate surface 411 of the printed circuit board 410. According to an embodiment, the at least one dielectric material 450 or 451 can include a first dielectric material 450 which is arranged in a scheme in which at least part is overlapped with the first edge region (E1) of the printed circuit board 410, and a second dielectric material 451 which is arranged in a scheme in which at least part is overlapped with the second edge region (E2) of the printed circuit board 410. According to an embodiment, the first dielectric material 450 and/or the second dielectric material 451 can be formed of the same material as the printed circuit board 410 or be formed of polymer material as well. For example, the first dielectric material 450 and/or the second dielectric material 451 can utilize at least one of flame retardant (FR)-1, FR-2, FR-3, FR-4 or FR-6 defined in the national electrical manufacturers association (NEMA). For example, the first dielectric material 450 and/or the second dielectric material 451 can utilize at least one of a composite type of laminate material bonded with a flame retardant epoxy resin (CEM)-1 or a CEM-3 defined in the NEMA as well. According to an embodiment, the first dielectric material 450 and the second dielectric material 451 can reduce the distortion of signals which are radiated from the second antenna array 430 and the third antenna array 440. For instance, the first dielectric material 450 and the second dielectric material 451 can reduce a shadow region (e.g., a region where a beam pattern size is decreased) which is provided at a contact point between a front plate (e.g., the front plate 202 of FIG. 2A), and a housing (e.g., the housing 210 of FIG. 2A), of an electronic device (e.g., the electronic device 200 of FIG. 2A) having different permittivity, or between a back plate (e.g., the back plate 211 of FIG. 2A) and the housing.

According to various embodiments, the communication device 400 can include at least one electrical connection member for electrically connecting with a main printed circuit board (PCB) (e.g., the printed circuit board 224 of FIG. 2C) of an electronic device through at least a partial region of the printed circuit board 410. According to an embodiment, the electrical connection member can be electrically connected through the first substrate surface 411 of the printed circuit board 410. According to an embodiment, the electrical connection member can include a flexible printed circuit board (FPCB) 500. According to an embodiment, the flexible printed circuit board 500 can be electrically connected to the printed circuit board 410 through solder bonding in a coupled region (region A). According to an embodiment, the solder bonding can include anisotropic conductive film (ACF) bonding, solder ball jetting bonding, hot bar bonding or auto-alignable solder adhesive (ASA) bonding.

According to various embodiments, the coupled region (region A) of the flexible printed circuit board 500 and the printed circuit board 410 shields RF signal wiring by an improved peripheral ground structure according to exemplary embodiments of the disclosure, so miss-matching caused by the peripheral exposure of the RF signal wiring, or an unstable loss of an RF loss, can be excluded.

Figure 5:
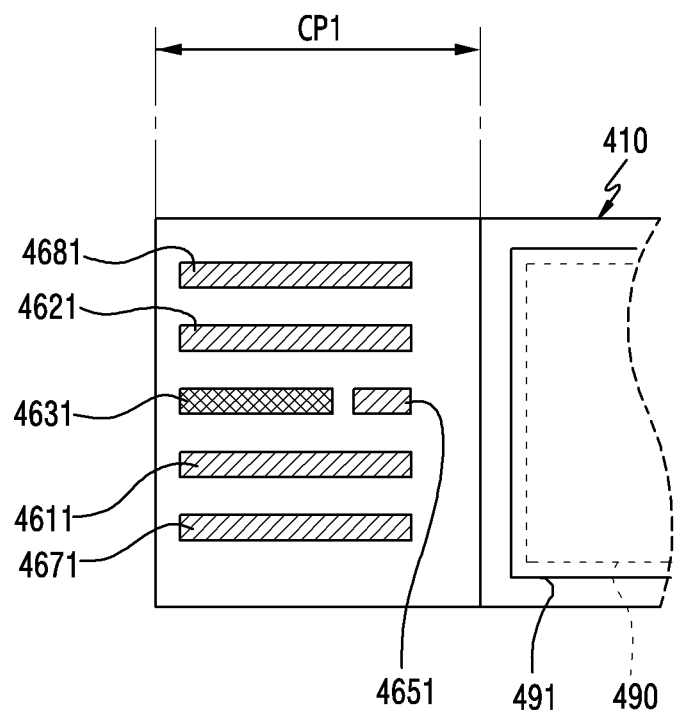
FIG. 5 is a diagram illustrating a construction of a coupling part of a printed circuit board according to various embodiments of the disclosure.
Figure 7A:
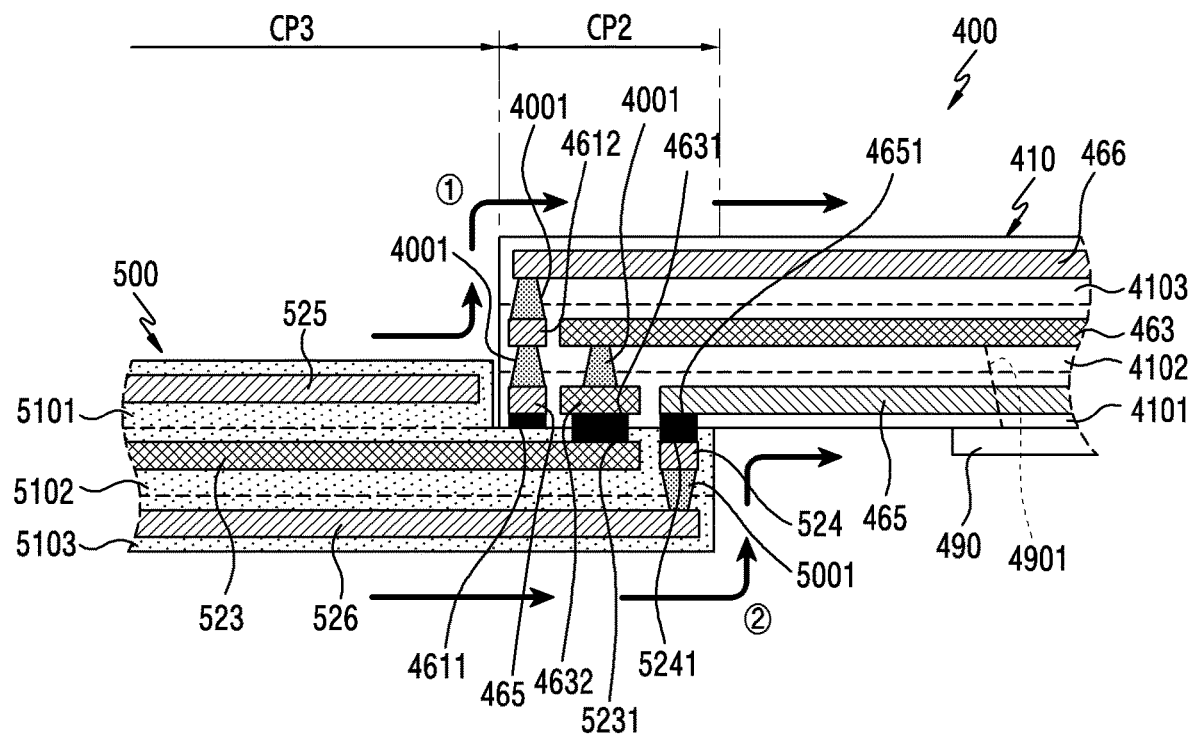
FIG. 7A and FIG. 7B are cross sections illustrating a state of solder bonding of a printed circuit board and a flexible printed circuit board according to various embodiments of the disclosure.
Figure 7B:
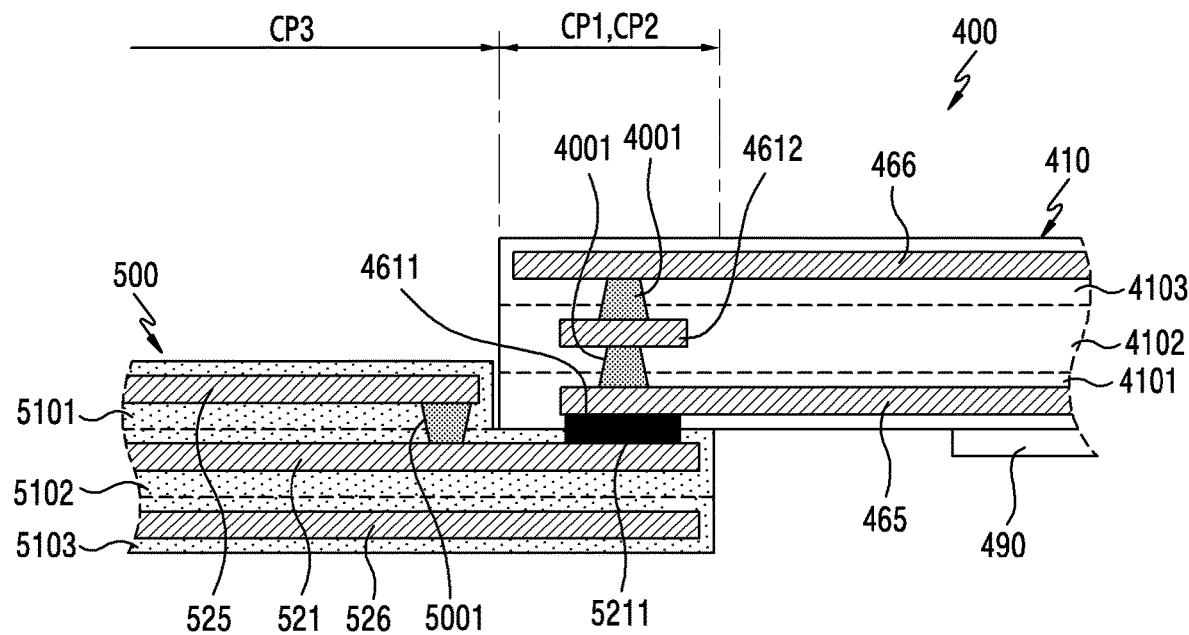

FIG. 5 is a diagram illustrating a construction of a coupling part (CP1) of the printed circuit board 410 according to various embodiments of the disclosure. FIG. 7A and FIG. 7B are cross sections illustrating a state of solder bonding of the printed circuit board 410 and the flexible printed circuit board 500 according to various embodiments of the disclosure.

Figure 6A:
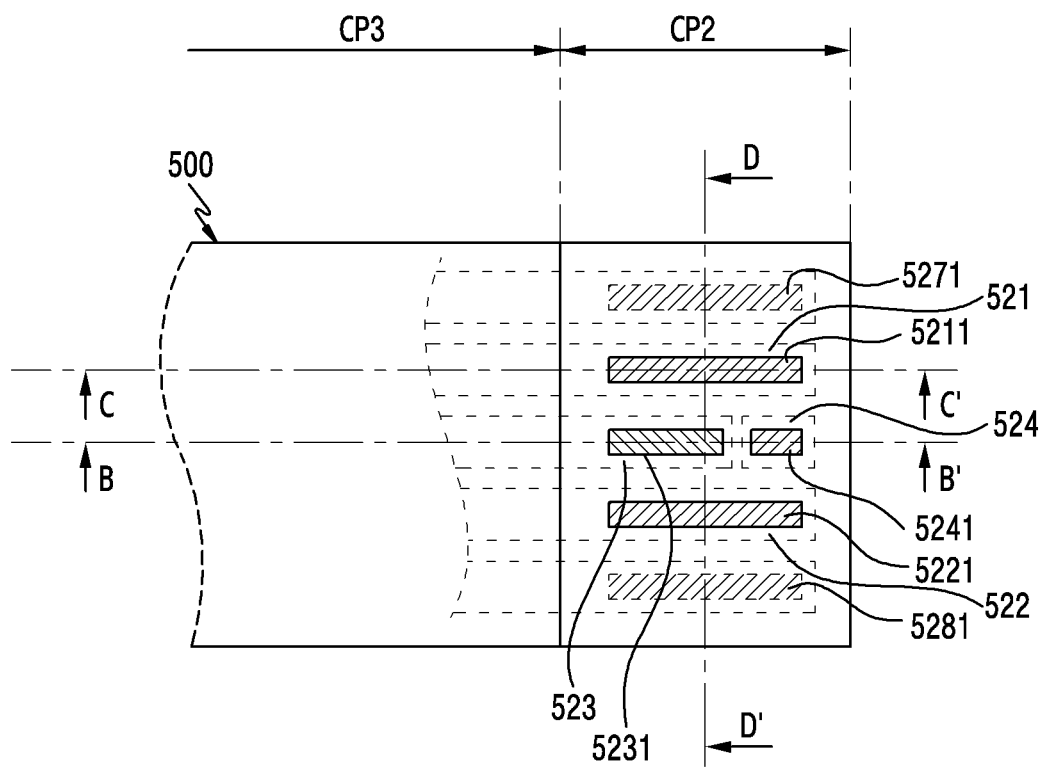
FIG. 6A is a diagram illustrating a construction of a coupling part of a flexible printed circuit board according to various embodiments of the disclosure.

Referring to FIG. 5, the printed circuit board 410 can include a first coupling part (CP1) for electrically connecting with a second coupling part (e.g., a second coupling part (CP2) of FIG. 6A) of a flexible printed circuit board (e.g., a flexible printed circuit board 500 of FIG. 6A). According to an embodiment, the printed circuit board 410 can include a first connection pad 4611 exposed out in the first coupling part (CP1), a second connection pad 4621 spaced a specific interval apart from the first connection pad 4611 and arranged, and a third connection pad 4631 arranged between the first connection pad 4611 and the second connection pad 4621. According to an embodiment, the printed circuit board 410 can include a fourth connection pad 4651 spaced a specific interval apart on the same line as the third connection pad 4631. According to an embodiment, the first connection pad 4611, the second connection pad 4621 and the fourth connection pad 4651 can be electrically connected to the ground of the printed circuit board 410. According to an embodiment, the third connection pad 4631 arranged between the first connection pad 4611 and the second connection pad 4621 can be connected to first signal wiring (e.g., first signal wiring 463 of FIG. 7A) for transmitting an RF signal, thereby being electrically connected to the wireless communication circuit 490. According to an embodiment, the first coupling part (CP1) can arrange additional connection pads 4671 and 4681 arranged outside the first connection pad 4611 and the second connection pad 4621 as well. According to an embodiment, the additional connection pads 4671 and 4681 can be electrically connected to another signal wiring or be electrically connected to the ground as well.

Referring to FIG. 7A, the printed circuit board 410 can include a plurality of insulation layers 4101, 4102 and 4103 which are arranged to be adjacent. According to an embodiment, the printed circuit board 410 can include a first insulation layer 4101, a second insulation layer 4102 arranged to be adjacent with the first insulation layer 4101, and a third insulation layer 4103 arranged to be adjacent with the second insulation layer 4102. According to an embodiment, the first, second, third and fourth connection pads 4611, 4621, 4631 and 4651 and the additional connection pads 4671 and 4681 can be arranged to be exposed outside the first coupling part (CP1) of the printed circuit board 410 through the first insulation layer 4101. According to an embodiment, the printed circuit board 410 can include a first ground plain 465 arranged through the first insulation layer 4101, and a second ground plain 466 arranged through the third insulation layer 4103. According to an embodiment, the first, second and fourth connection pads 4611, 4621 and 4651 can be electrically connected to the first ground plain 465. According to an embodiment, the first and second connection pads 4611 and 4621 can be electrically connected to the second ground plain 4102 through at least one first auxiliary wiring 4612 and at least one conductive via 4001.

According to various embodiments, the first signal wiring 463 electrically connected to the third connection pad 4631 can be arranged through the second insulation layer 4102. According to an embodiment, the first signal wiring 463 operating as RF signal wiring can be electrically connected to the third connection pad 4631 through a second auxiliary wiring 4632 arranged in the first insulation layer 4101 and a conductive via 4001. According to an embodiment, the first signal wiring 463 can be electrically connected to the wireless communication circuit 490 through an electrical path 4901 arranged in the printed circuit board 410.

FIG. 6A is a diagram illustrating a construction of a coupling part (CP2) of the flexible printed circuit board 500 according to various embodiments of the disclosure.

Referring to FIG. 6A, the flexible printed circuit board 500 can include a second coupling part (CP2) for coupling with a first coupling part (e.g., the first coupling part (CP1) of FIG. 5) of a printed circuit board (e.g., the printed circuit board 410 of FIG. 5), and a connection part (CP3) extended from the second coupling part (CP2). According to an embodiment, the flexible printed circuit board 500 can include a first access pad 5211 exposed out in the second coupling part (CP2) and electrically connected to a first connection pad (e.g., the first connection pad 4611 of FIG. 5), a second access pad 5221 electrically connected to a second connection pad (e.g., the second connection pad 4621 of FIG. 5), a third access pad 5231 electrically connected to a third connection pad (e.g., the third connection pad 4631 of FIG. 5), and a fourth access pad 5241 electrically connected to a fourth connection pad (e.g., the fourth connection pad 4651 of FIG. 5). According to an embodiment, the first access pad 5211, the second access pad 5221 and the fourth access pad 5241 can be electrically connected to ground wiring of the flexible printed circuit board 500, and the third access pad 5231 can be electrically connected to second signal wiring (e.g., the second signal wiring 523 of FIG. 6B) (e.g., RF signal wiring). According to an embodiment, the second coupling part (CP2) can include additional access pads 5271 and 5281 which are arranged outside the first access pad 5211 and the second access pad 5221 and are correspondingly connected to additional connection pads (e.g., the additional connection pads 4671 and 4681 of FIG. 5) of a printed circuit board (e.g., the printed circuit board 410 of FIG. 5).

Figure 6B:
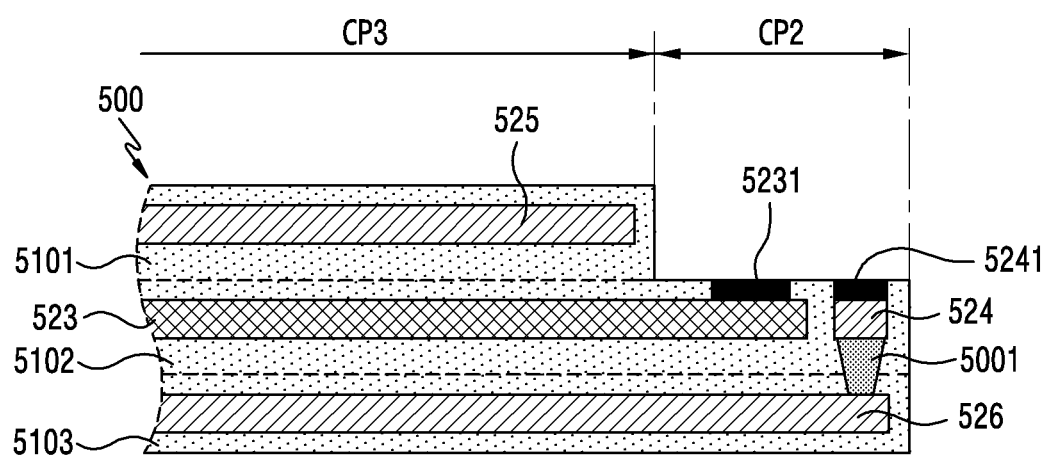
FIG. 6B is a cross section viewed along line B-B' of FIG. 6A according to various embodiments of the disclosure.
Figure 6C:
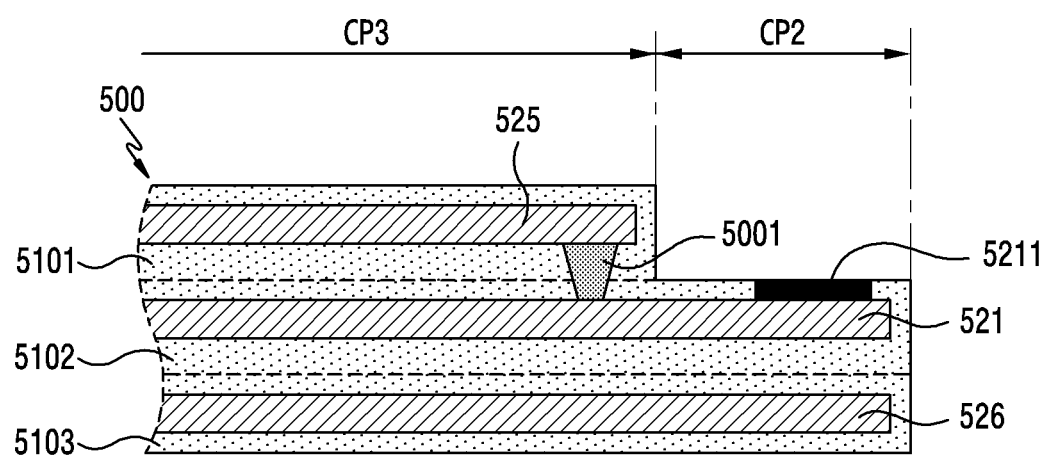
FIG. 6C is a cross section viewed along line C-C' of FIG. 6A according to various embodiments of the disclosure.
Figure 6D:
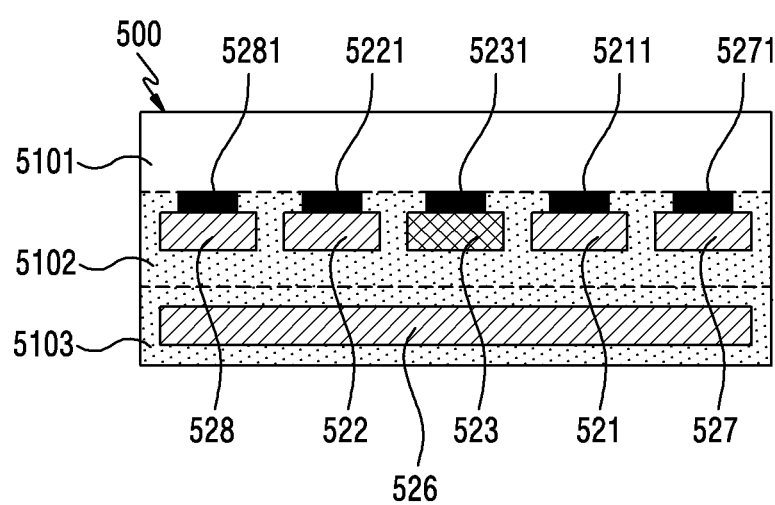
FIG. 6D is a cross section viewed along line D-D' of FIG. 6A according to various embodiments of the disclosure.

FIG. 6B is a cross section viewed along line B-B' of FIG. 6A according to various embodiments of the disclosure. FIG. 6C is a cross section viewed along line C-C' of FIG. 6A according to various embodiments of the disclosure. FIG. 6D is a cross section viewed along line D-D' of FIG. 6A according to various embodiments of the disclosure.

Referring to FIG. 6B to FIG. 6D, the flexible printed circuit board 500 can include a plurality of insulation layers 5101, 5102 and 5103 which are arranged to be adjacent. According to an embodiment, the flexible printed circuit board 500 can include a fourth insulation layer 5101, a fifth insulation layer 5102 arranged to be adjacent with the fourth insulation layer 5101, and a sixth insulation layer 5103 arranged to be adjacent with the fifth insulation layer 5102. According to an embodiment, the flexible printed circuit board 500 can include a third ground plain 525 arranged through the fourth insulation layer 5101, and a fourth ground plain 526 arranged through the sixth insulation layer 5103. According to an embodiment, in the second coupling part (CP2), the first, second, third and fourth access pads 5211, 5221, 5231 and 5241 and the additional access pads 5271 and 5281 can be arranged to be exposed through the fifth insulation layer 5102 having excluded the fourth insulation layer 5101. According to an embodiment, the first access pad 5211 can be electrically connected to first ground wiring 521 which is extended to the connection part (CP3) through the fifth insulation layer 5102. According to an embodiment, the second access pad 5221 can be electrically connected to second ground wiring 522 which is extended to the connection part (CP3) through the fifth insulation layer 5102. According to an embodiment, the third access pad 5231 can be electrically connected to second signal wiring 523 (e.g., RF signal wiring) which is extended to the connection part (CP2) through the fifth insulation layer 5102. According to an embodiment, the fourth access pad 5241 can be electrically connected to the fourth ground plain 526, through third auxiliary wiring 524 arranged through the fifth insulation layer 5102 and a conductive via 5001.

FIG. 7A and FIG. 7B are cross sections illustrating a state of solder bonding of the printed circuit board 410 and the flexible printed circuit board 500 according to various embodiments of the disclosure.

Referring to FIG. 7A and FIG. 7B, the first coupling part (CP1) of the printed circuit board 410 and the second coupling part (CP2) of the flexible printed circuit board 500 can be electrically connected by solder bonding. In this case, the first, second, third and fourth connection pads 4611, 4621, 4631 and 4651, and the additional connection pads 4671 and 4681, of the printed circuit board 410 can be connected to physically get in contact with the first, second, third and fourth access pads 5211, 5221, 5231 and 5241, and the additional access pads 5271 and 5281, of the flexible printed circuit board 500. According to an embodiment, the first signal wiring 463 arranged through the second insulation layer 4102 of the printed circuit board 410 can be electrically connected to the third connection pad 4631, through the second auxiliary wiring 4632 arranged through the first insulation layer 4101 and the conductive via 4001. According to an embodiment, the third connection pad 4631 can be electrically connected to the third access pad 5231 of the flexible printed circuit board 500. According to an embodiment, the third access pad 5231 can be electrically connected to the second signal wiring 523 which is arranged through the fifth insulation layer 5102 of the flexible printed circuit board 500.

According to various embodiments, the fourth connection pad 4651 electrically connected to the first ground plain 4101 of the printed circuit board 410 can be electrically connected to the fourth access pad 5241 of the flexible printed circuit board 500, whereby a second ground path (g) can be formed.

According to an embodiment, the fourth access pad 5241 can be electrically connected to the fourth ground plain 526, through the third auxiliary wiring 524 arranged through the fifth insulation layer 5102 of the flexible printed circuit board 500 and the conductive via 5001. According to an embodiment, the second ground plain 466 can be extended to and arranged in at least partial region of the first coupling part (CP1) in the third insulation layer 4103, and can be electrically connected to the first connection pad 4611 and/or the second connection pad 4621, through at least one first auxiliary wiring 4612 and the conductive via 4001. According to an embodiment, the first connection pad 4611 and/or the second connection pad 4621 can be connected to the first access pad 5211, and/or the second access pad 5221, of the flexible printed circuit board 500. According to an embodiment, the first access pad 5211 and/or the second access pad 5221 can be electrically connected to the first ground wiring 521 and/or the second ground wiring 522 which are arranged through the fifth insulation layer 5102. According to an embodiment, the first ground wiring 521 and/or the second ground wiring 522 can be electrically connected to the third ground plain 525 through at least one conductive via 5001, whereby a first ground path (a) can be formed. According to various embodiments, a return path of an RF signal can be formed identically with the directions of the ground paths (a, g).

Accordingly, the first signal wiring 463 and the second signal wiring 523 electrically connected in the first coupling part (CP1) of the printed circuit board 410 and the second coupling part (CP2) of the flexible printed circuit board 500 arrange, at left and right sides, the first ground wiring 521 and the second ground wiring 522, and arrange, at a lower side, ground wiring connected by the first insulation layer 4101, the third auxiliary wiring 524 and the fourth ground plain 526, and are surrounded, at an upper side, by ground wiring connected by the second ground plain 4102, the first auxiliary wiring 4612, the first ground plain 4101 and the third ground plain 525, whereby a ground shield structure can be implemented.

Figure 8:
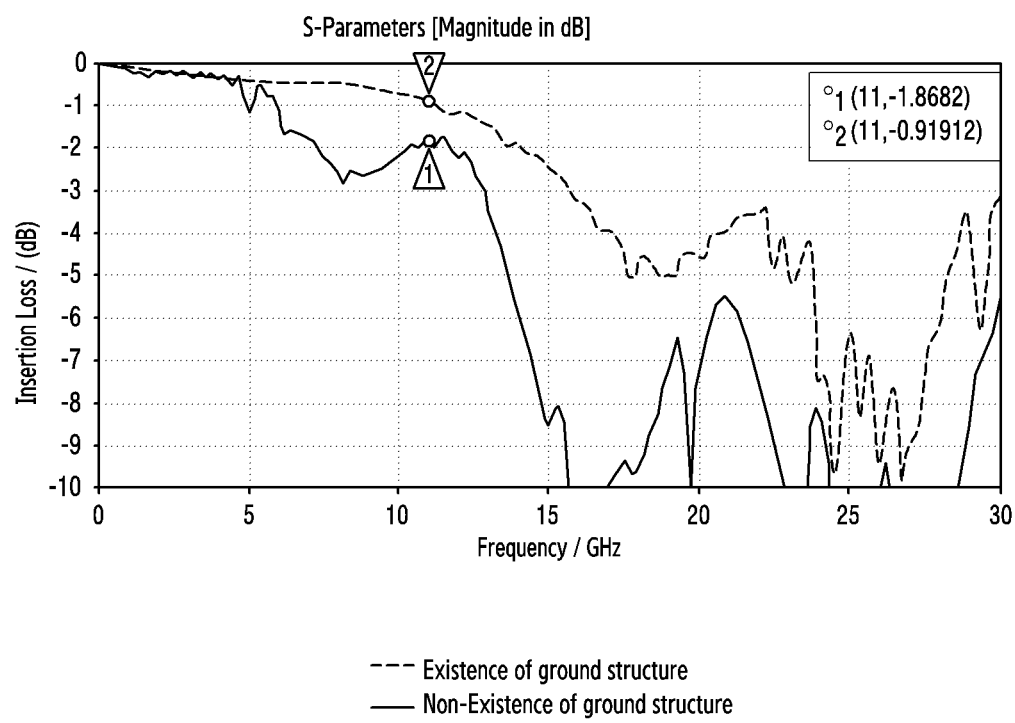
FIG. 8 is a graph comparing a loss dependent on the existence or non-existence of a ground structure of a coupling part according to various embodiments of the disclosure.

FIG. 8 is a graph comparing an insertion loss dependent on the existence or non-existence of a ground structure of a coupling part according to various embodiments of the disclosure.

Referring to FIG. 8, it can be appreciated that an insertion loss (e.g., an RF loss) in a state where the above-described ground structure has been applied is more smoothly varied than an insertion loss in a state where the ground structure has not been applied. In detail, a loss value (S11) of about (−) 1.8682 dB is shown at a point 2 in a state where the ground structure has been applied, whereas a loss value of about (−) 0.91912 dB can be identified at a point 1 (for example, a frequency corresponding to the point 2) in a state where the ground structure has not been applied. This can mean a rate between a magnitude of a signal inputted through the coupling part of various embodiments and a magnitude of a signal outputted, and can mean that the insertion loss is relatively stably varied, as the insertion loss value in the state where the ground structure has been applied shows as a smaller value relatively in a (−) direction according to an exemplary embodiment of the disclosure.

Figure 9A:
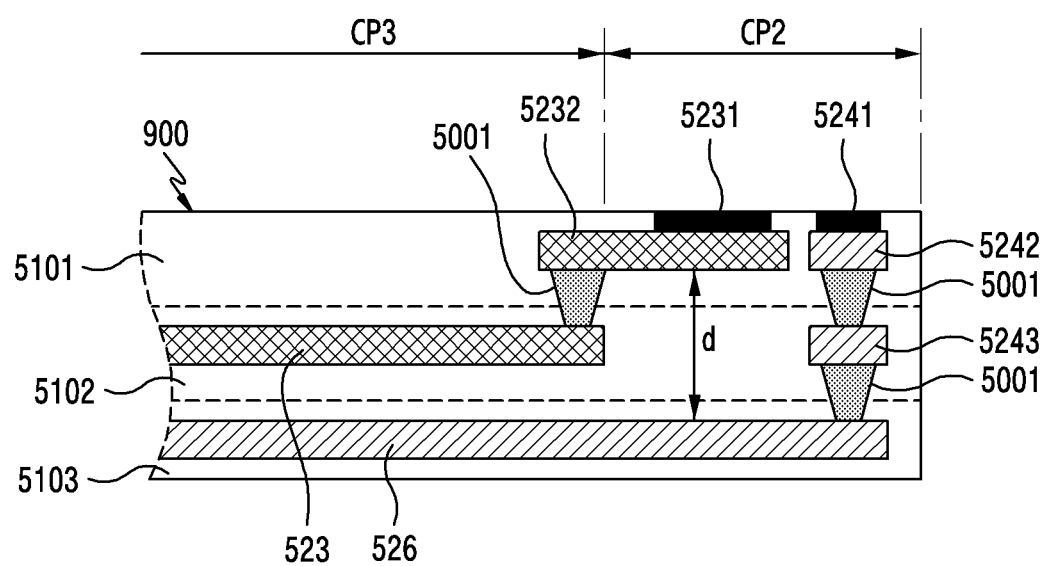
FIG. 9A is a cross section viewed along line B-B' of FIG. 6A according to various embodiments of the disclosure.
Figure 9B:
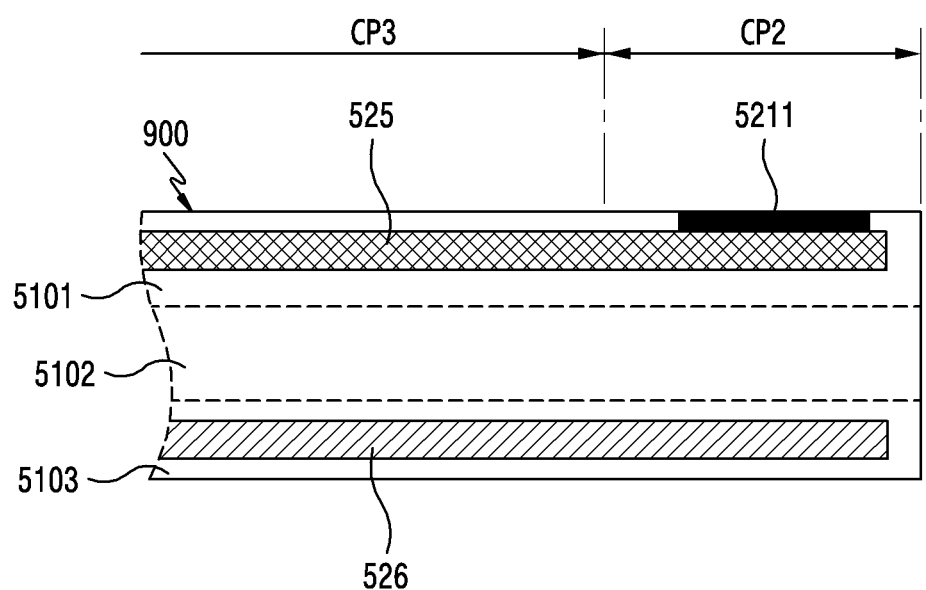
FIG. 9B is a cross section viewed along line C-C' of FIG. 6A according to various embodiments of the disclosure.
Figure 9C:
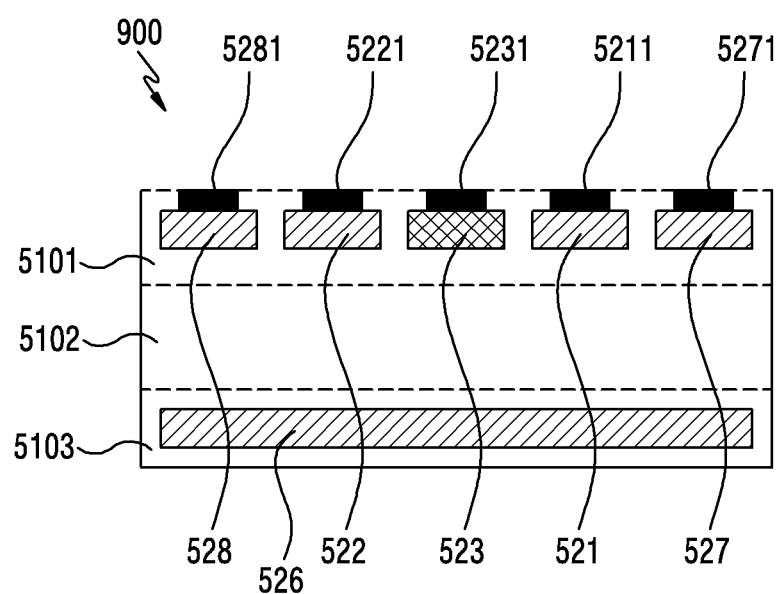
FIG. 9C is a cross section viewed along line D-D' of FIG. 6A according to various embodiments of the disclosure.

FIG. 9A is a cross section viewed along line B-B' of FIG. 6A according to various embodiments of the disclosure. FIG. 9B is a cross section viewed along line C-C' of FIG. 6A according to various embodiments of the disclosure. FIG. 9C is a cross section viewed along line D-D' of FIG. 6A according to various embodiments of the disclosure.

A flexible printed circuit board 900 of FIG. 9A, FIG. 9B and FIG. 9C can be at least in part similar with the flexible printed circuit board 500 of FIG. 6A, FIG. 6B, FIG. 6C and FIG. 6D or include other embodiments of the flexible printed circuit board.

In describing the flexible printed circuit board 900 of FIG. 9A, FIG. 9B and FIG. 9C, the same components of the above-described flexible printed circuit board (e.g., the flexible printed circuit board 500 of FIGS. 6A, 6B and 6C and FIG. 6D) have used the same symbols, and their detailed description can be omitted.

Referring to FIG. 9A, FIG. 9B and FIG. 9C, in the flexible printed circuit board 900, the first, second, third and fourth access pads 5211, 5221, 5231 and 5241 and the additional access pads 5271 and 5281 can be arranged in the fourth insulation layer 5101. In this case, the third access pad 5231 can be electrically connected to the fourth auxiliary wiring 5232 arranged through the fourth insulation layer 5101, and the fourth auxiliary wiring 5232 can be electrically connected, through the conductive via 5001, to the second signal wiring 523 arranged in the fifth insulation layer 5102. According to an embodiment, the fourth access pad 5241 can be also electrically connected to the fifth auxiliary wiring 5242 arranged in the fourth insulation layer 5101. According to an embodiment, the fifth auxiliary wiring 5242 can be electrically connected to the fourth ground plain 526 arranged in the sixth insulation layer 5103, through the sixth auxiliary wiring 5243 arranged in the fifth insulation layer 5102 and at least one conductive via 5001.

According to various embodiments, as a spaced distance (d) between the fourth auxiliary wiring 5232 electrically connected to the second signal wiring 523 and arranged in the fourth insulation layer 5101 and the fourth ground plain 526 is secured in the second coupling part (CP2), it can be more advantageous to impedance matching.

Figure 10A:
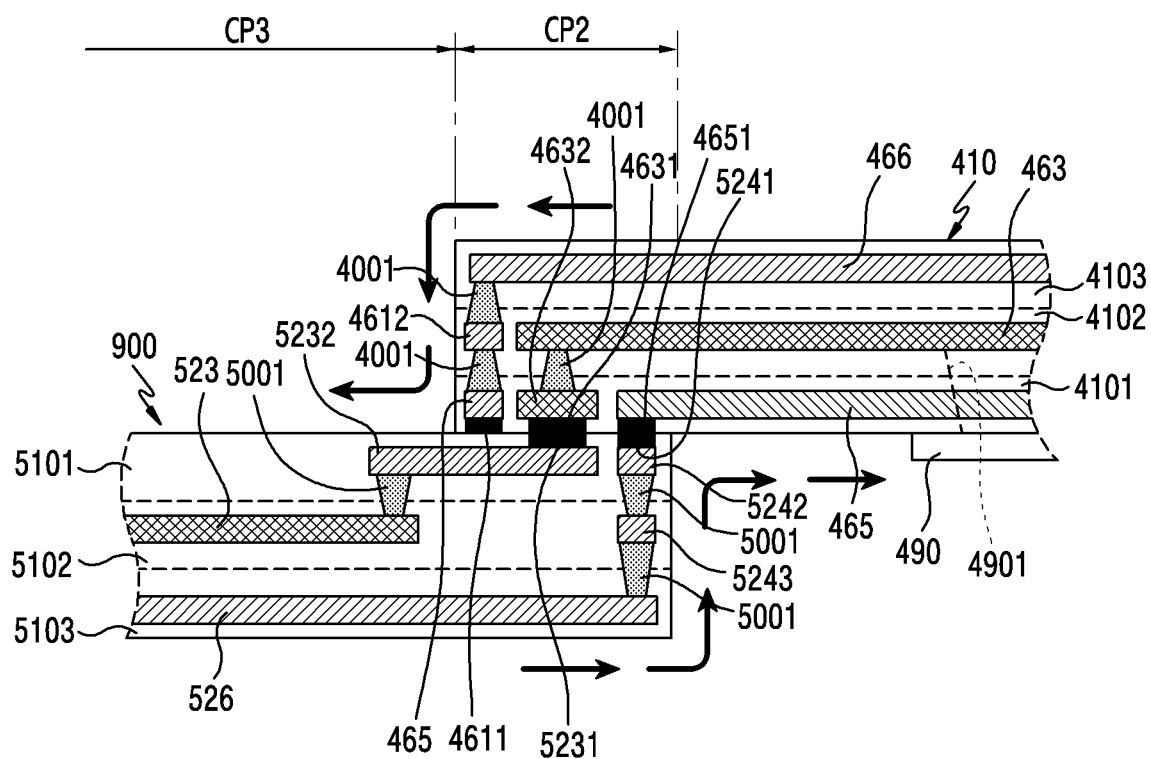
FIG. 10A and FIG. 10B are cross sections illustrating a state of solder bonding of a printed circuit board and a flexible printed circuit board according to various embodiments of the disclosure.
Figure 10B:
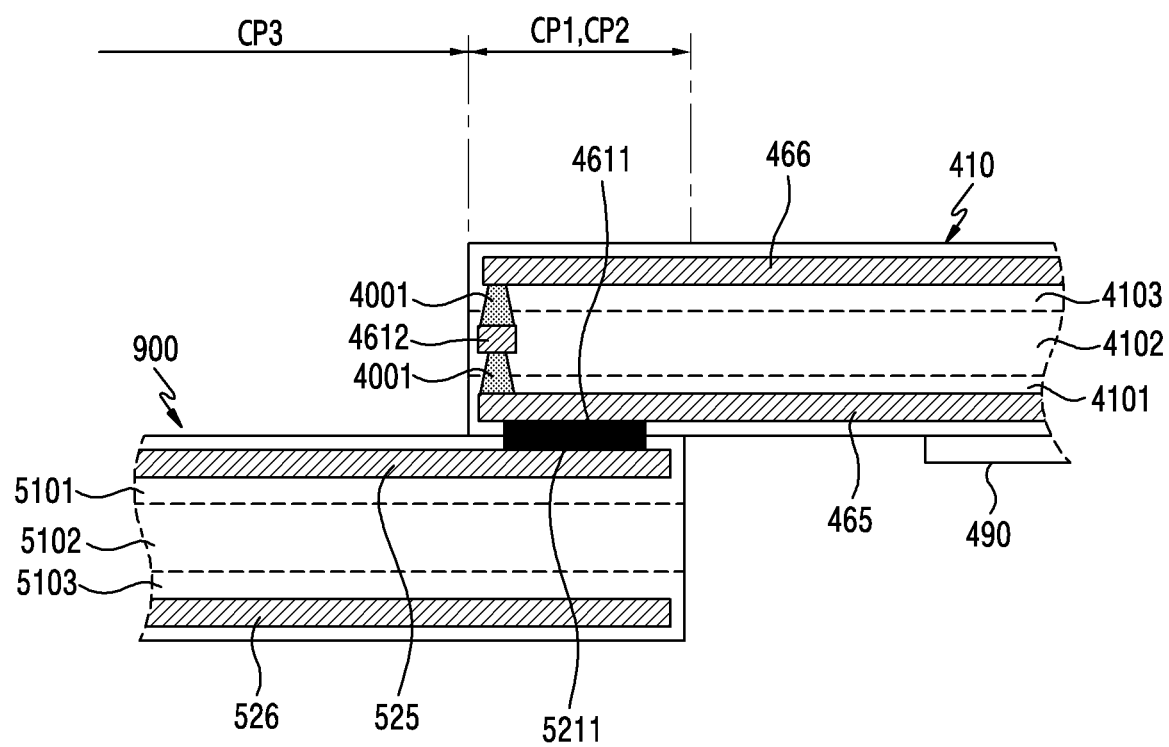

FIG. 10A and FIG. 10B are cross sections illustrating a state of solder bonding of a printed circuit board and a flexible printed circuit board according to various embodiments of the disclosure.

The flexible printed circuit board 900 of FIG. 10A and FIG. 10B can be at least in part similar with the flexible printed circuit board 500 of FIGS. 6A, 6B and 6C and FIG. 6D or include other embodiments of the flexible printed circuit board.

Referring to FIG. 10A and FIG. 10B, the first coupling part (CP1) of the printed circuit board 410 and the second coupling part (CP2) of the flexible printed circuit board 500 can be electrically connected by solder bonding. In this case, the first, second, third and fourth connection pads 4611, 4621, 4631 and 4651, and the additional connection pads 4671 and 4681, of the printed circuit board 410 can physically get in contact with the first, second, third and fourth access pads 5211, 5221, 5231 and 5241, and the additional access pads 5271 and 5281, of the flexible printed circuit board 500. According to an embodiment, the first signal wiring 463 arranged through the second insulation layer 4102 of the printed circuit board 410 can be electrically connected to the third connection pad 4631, through the second auxiliary wiring 4632 arranged through the first insulation layer 4101 and the conductive via 4001. According to an embodiment, the third connection pad 4631 can be electrically connected to the third access pad 5231 of the flexible printed circuit board 500. According to an embodiment, the third access pad 5231 can be electrically connected to the fourth auxiliary wiring 5232 arranged through the fourth insulation layer 5101 of the flexible printed circuit board 500. According to an embodiment, the fourth auxiliary wiring 5232 arranged in the fourth insulation layer 5101 can be electrically connected, through a conductive via 5001, to the second signal wiring 523 arranged in the fifth insulation layer 5102.

According to various embodiments, the fourth connection pad 4651 electrically connected to the first ground plain 4101 of the printed circuit board 410 can be electrically connected to the fourth access pad 5241 of the flexible printed circuit board 500. According to an embodiment, the fourth access pad 5241 can be electrically connected to the fourth ground plain 526 arranged in the sixth insulation layer 5103, through the fifth auxiliary wiring 5242, the sixth auxiliary wiring 5243 and a conductive via 5001 which are arranged through the fourth insulation layer 5101, and the fifth insulation layer 5102, of the flexible printed circuit board 500. According to an embodiment, the second ground plain 466 can be extended to and arranged in at least partial region of the first coupling part (CP1) in the third insulation layer 4103, and can be electrically connected to the first connection pad 4611 and/or the second connection pad 4621 through at least one first auxiliary wiring 4612 and the conductive via 4001. According to an embodiment, the first connection pad 4611 and/or the second connection pad 4621 can be electrically connected to the first ground wiring 521 and/or the second ground wiring 522 which are arranged through the fourth insulation layer 5101 of the flexible printed circuit board 500. According to an embodiment, the first ground wiring 521 and/or the second ground wiring 522 can be electrically connected to the third ground plain 525 through at least one conductive via 5001.

Accordingly, the first signal wiring 463 and the second signal wiring 523 electrically connected in the first coupling part (CP1) of the printed circuit board 410 and the second coupling part (CP2) of the flexible printed circuit board 500 arrange, at left and right sides, the first ground wiring 521 and the second ground wiring 522, and are surrounded, at a lower side, by ground wiring connected by the first ground plain 4101, the fifth auxiliary wiring 5242, the sixth auxiliary wiring 5243 and the fourth ground plain 526, whereby a ground shield structure can be implemented.

According to various embodiments, an electronic device (e.g., the electronic device 220 of FIG. 2C) can include a circuit element (e.g., the wireless communication circuit 490 of FIG. 7A), a printed circuit board (e.g., the printed circuit board 410 of FIG. 5) including a first connection pad (e.g., the first connection pad 4611 of FIG. 5) connected to the ground of the electronic device, a second connection pad (the second connection pad 4621 of FIG. 5), and a third connection pad (e.g., the third connection pad 4631 of FIG. 5) arranged between the first connection pad and the second connection pad and connected to a signal terminal of the circuit element, and a flexible printed circuit board (FPCB) (e.g., the flexible printed circuit board of FIG. 6A) including a coupling part (e.g., the coupling part (CP2) of FIG. 6A) connected to the printed circuit board, and a connection part (e.g., the connection part (CP3) of FIG. 6A) extending from the coupling part. The flexible printed circuit board can include first ground wiring (e.g., the first ground wiring 521 of FIG. 6D) connected to the first connection pad and extending from the coupling part to the connection part in a specified direction, second ground wiring (e.g., the second ground wiring 522 of FIG. 6D) connected to the second connection pad and extending from the coupling part to the connection part in the specified direction, signal wiring (e.g., the second signal wiring 523 of FIG. 6D) connected to the third connection pad and extending from the coupling part to the connection part in the specified direction, while being arranged between the first ground wiring and the second ground wiring, and third ground wiring (e.g., the third auxiliary wiring 524 of FIG. 6B) arranged in an opposite direction to the specified direction so as to be connected, in the coupling part, to the first ground wiring and the second ground wiring and surround the signal wiring.

According to various embodiments, the printed circuit board can include a first insulation layer (e.g., the first insulation layer 4101 of FIG. 7A), a second insulation layer (e.g., the second insulation layer 4102 of FIG. 7A) arranged to be adjacent with the first insulation layer, and a third insulation layer (e.g., the third insulation layer 4103 of FIG. 7A) arranged to be adjacent with the second insulation layer. The third connection pad can be electrically connected to the signal wiring (e.g., the first signal wiring 463 of FIG. 7A) arranged through the second insulation layer.

According to various embodiments, the first connection pad, the second connection pad and the third connection pad can be arranged to be exposed out through the first insulation layer.

According to various embodiments, the electronic device can include a first ground plain (e.g., the first ground plain 465 of FIG. 7A) arranged in the first insulation layer, and a second ground plain (e.g., the second ground plain 466 of FIG. 7A) arranged in the third insulation layer. The first connection pad and the second connection pad can be electrically connected to at least one of the first ground plain and/or the second ground plain.

According to various embodiments, the electronic device can further include a fourth connection pad (e.g., the fourth connection pad 4651 of FIG. 5) arranged near the third connection pad, and the fourth connection pad can be electrically connected to the first ground plain.

According to various embodiments, the flexible printed circuit board can include a fourth insulation layer (e.g., the fourth insulation layer 5101 of FIG. 7A), a fifth insulation layer (e.g., the fifth insulation layer 5102 of FIG. 7A) which is arranged to be adjacent with the fourth insulation layer, and in which the fourth insulation layer is not arranged in at least partial region corresponding to the coupling part, and a sixth insulation layer (e.g., the sixth insulation layer 5103 of FIG. 7A) arranged to be adjacent with the fifth insulation layer. At least part of the first ground wiring, the second ground wiring, the signal wiring and the third ground wiring can be exposed through the partial region of the fifth insulation layer.

According to various embodiments, the electronic device can include a first access pad (e.g., the first access pad 5211 of FIG. 6A) electrically connected to the first ground wiring, arranged to be exposed through the partial region of the fifth insulation layer, a second access pad (the second access pad 5221 of FIG. 6A) electrically connected to the second ground wiring, a third access pad (the third access pad 5231 of FIG. 6A) electrically connected to the signal wiring, and a fourth access pad (the fourth access pad 5241 of FIG. 6A) electrically connected to the third ground wiring.

According to various embodiments, the fourth access pad can be arranged in a position corresponding to the fourth connection pad.

According to various embodiments, the electronic device can include a third ground plain (e.g., the third ground plain 525 of FIG. 7A) arranged in the fourth insulation layer, and a fourth ground plain (e.g., the fourth ground plain 526 of FIG. 7A) arranged in the sixth insulation layer. At least part of the third ground wiring can be electrically connected to the fourth ground plain.

According to various embodiments, the third ground wiring can be electrically connected to the fourth ground plain through a conductive via (the conductive via 5001 of FIG. 7A).

According to various embodiments, while the printed circuit board and the flexible printed circuit board are coupled, at least one of the second ground plain or the fourth ground plain can be extended to and arranged in at least part of the coupling part.

According to various embodiments, the flexible printed circuit board can include a fourth insulation layer, a fifth insulation layer arranged to be adjacent with the fourth insulation layer, and a sixth insulation layer arranged to be adjacent with the fifth insulation layer. At least part of the first ground wiring, the second ground wiring, the signal wiring and the third ground wiring can be exposed to a region corresponding to the coupling part of the fourth insulation layer.

According to various embodiments, the flexible printed circuit board can be solder bonded such that at least part of the first ground wiring of the coupling part, the second ground wiring and the signal wiring corresponds to the first connection pad of the printed circuit board, the second connection pad, and the third connection pad.

According to various embodiments, the solder bonding can include anisotropic conductive film (ACF) bonding, solder ball jetting bonding, hot bar bonding, or auto-alignable solder adhesive (ASA) bonding.

According to various embodiments, the printed circuit board can include at least one antenna electrically connected to the circuit element. The circuit element can be configured to transmit and/or receive a signal having a frequency of a range of 10 GHz to 100 GHz through the at least one antenna.

According to various embodiments, a flexible printed circuit board (e.g., the flexible printed circuit board 500 of FIG. 6D) can include a flexible printed circuit board layer including a coupling part (e.g., the second coupling part (CP2) of FIG. 6A) connected to an external circuit board (e.g., the printed circuit board 410 of FIG. 7A) and a connection part (e.g., the connection part (CP3) of FIG. 6A) extending from the coupling part. The flexible printed circuit board layer can include first ground wiring (the first ground wiring 521 of FIG. 6D) extending from the coupling part to the connection part in a specified direction, second ground wiring (the second ground wiring 522 of FIG. 6D) extending from the coupling part to the connection part in the specified direction, signal wiring (the second signal wiring 523 of FIG. 6D) extending from the coupling part to the connection part in the specified direction, while being arranged between the first ground wiring and the second ground wiring, and third ground wiring (the third auxiliary wiring of FIG. 6B) arranged in an opposite direction to the specified direction so as to be connected, in the coupling part, to the first ground wiring and the second ground wiring and surround the signal wiring.

According to various embodiments, the flexible printed circuit board can include a first insulation layer, a second insulation layer arranged to be adjacent with the first insulation layer, and a third insulation layer arranged to be adjacent with the second insulation layer.

According to various embodiments, the fourth insulation layer is not arranged in at least partial region of the second insulation layer corresponding to the coupling part, and at least part of the first ground wiring, the second ground wiring, the signal wiring and the third ground wiring can be exposed through the at least partial region of the second insulation layer.

According to various embodiments, at least part of the first ground wiring, the second ground wiring, the signal wiring and the third ground wiring can be exposed through a region corresponding to the coupling part of the first insulation layer.

According to various embodiments, the electronic device can include a first ground plain arranged in the first insulation layer, and a second ground plain arranged in the third insulation layer. At least part of the third ground wiring can be electrically connected to the second ground plain.

Various embodiments of the disclosure disclosed in the specification and drawings just merely suggest specific examples so as to easily explain the technology content of an embodiment of the disclosure and help the understanding of the embodiment of the disclosure, and do not intend to limit the scope of the embodiment of the disclosure. Accordingly, the scope of various embodiments of the disclosure should be construed as including all modified or changed forms drawn on the basis of the technological spirit of the various embodiments of the disclosure, besides embodiments disclosed herein.

What is claimed is:

1. An electronic device comprising:
   a circuit element;
   a printed circuit board comprising a first connection pad connected to the ground of the electronic device, a second connection pad, and a third connection pad arranged between the first connection pad and the second connection pad and connected to a signal terminal of the circuit element; and
   a flexible printed circuit board (FPCB) comprising a coupling part connected to the printed circuit board, and a connection part extending from the coupling part,
   wherein the FPCB comprises:
   first ground wiring connected to the first connection pad and extending from the coupling part to the connection part in a specified direction;
   second ground wiring connected to the second connection pad and extending from the coupling part to the connection part in the specified direction;
   signal wiring connected to the third connection pad and extending from the coupling part to the connection part in the specified direction, while being arranged between the first ground wiring and the second ground wiring; and
   third ground wiring arranged in an opposite direction to the specified direction so as to be connected, in the coupling part, to the first ground wiring and the second ground wiring and surround the signal wiring.

2. The electronic device of claim 1, wherein the printed circuit board comprises:
   a first insulation layer;
   a second insulation layer arranged to be adjacent with the first insulation layer; and a third insulation layer arranged to be adjacent with the second insulation layer, and wherein the third connection pad is electrically connected to the signal wiring arranged through the second insulation layer.

3. The electronic device of claim 2, wherein the first connection pad, the second connection pad and the third connection pad are arranged to be exposed out through the first insulation layer.

4. The electronic device of claim 2, comprising:
a first ground plain arranged in the first insulation layer; and
a second ground plain arranged in the third insulation layer,
wherein the first connection pad and the second connection pad are electrically connected to at least one of the first ground plain or the second ground plain.

5. The electronic device of claim 4, further comprising a fourth connection pad arranged near the third connection pad,
wherein the fourth connection pad is electrically connected to the first ground plain.

6. The electronic device of claim 5, wherein the flexible printed circuit board comprises:
a fourth insulation layer;
a fifth insulation layer which is arranged to be adjacent with the fourth insulation layer, and in which the fourth insulation layer is not arranged in at least partial region corresponding to the coupling part; and
a sixth insulation layer arranged to be adjacent with the fifth insulation layer, and
wherein at least part of the first ground wiring, the second ground wiring, the signal wiring and the third ground wiring is exposed through the partial region of the fifth insulation layer.

7. The electronic device of claim 6, comprising:
a first access pad electrically connected to the first ground wiring, arranged to be exposed through the partial region of the fifth insulation layer;
a second access pad electrically connected to the second ground wiring;
a third access pad electrically connected to the signal wiring; and
a fourth access pad electrically connected to the third ground wiring.

8. The electronic device of claim 7, wherein the fourth access pad is arranged in a position corresponding to the fourth connection pad.

9. The electronic device of claim 8, comprising:
a third ground plain arranged in the fourth insulation layer; and
a fourth ground plain arranged in the sixth insulation layer,
wherein at least part of the third ground wiring is electrically connected to the fourth ground plain.

10. The electronic device of claim 5, wherein the flexible printed circuit board comprises:
a fourth insulation layer;
a fifth insulation layer arranged to be adjacent with the fourth insulation layer; and
a sixth insulation layer arranged to be adjacent with the fifth insulation layer,
wherein at least part of the first ground wiring, the second ground wiring, the signal wiring and the third ground wiring is exposed to a region corresponding to a coupling part of the fourth insulation layer.

11. The electronic device of claim 4, wherein the third ground wiring is electrically connected to a fourth ground plain through a conductive via.

12. The electronic device of claim 11, wherein while the printed circuit board and the flexible printed circuit board are coupled, at least one of the second ground plain or the fourth ground plain is extended to and arranged in at least part of the coupling part.

13. The electronic device of claim 1, wherein the flexible printed circuit board is solder bonded such that at least part of the first ground wiring of the coupling part, the second ground wiring and the signal wiring corresponds to the first connection pad of the printed circuit board, the second connection pad, and the third connection pad.

14. The electronic device of claim 1, wherein the solder bonding comprises anisotropic conductive film (ACF) bonding, solder ball jetting bonding, hot bar bonding, or auto-alignable solder adhesive (ASA) bonding.

15. The electronic device of claim 1, wherein the printed circuit board comprises at least one antenna electrically connected to the circuit element, and
the circuit element is configured to transmit and/or receive a signal having a frequency of a range of 10 GHz to 100 GHz through the at least one antenna.

16. A flexible printed circuit board comprising:
coupling part connected to an external circuit board and a connection part extending from the coupling part,
wherein the flexible printed circuit board layer comprises,
a first ground wiring extending in a specified direction from the coupling part to the connection part;
a second ground wiring extending in the specified direction from the coupling part to the connection part;
a signal wiring extending in the specified direction from the coupling part to the connection part while being disposed between the first ground wiring and the second wiring; and
a third ground wiring disposed in a direction opposite to the specified direction so as to surround the signal wiring by being connected to the first ground wiring and the second ground wiring in the coupling part.

17. The flexible printed circuit board of claim 16, wherein flexible printed circuit board comprises:
a first insulation layer;
a second insulation layer arranged to be adjacent with the first insulation layer; and
a third insulation layer arranged to be adjacent with the second insulation layer.

18. The flexible printed circuit board of claim 17, wherein a fourth insulating layer is not disposed in at least a portion of the second insulating layer corresponding to the coupling part,
at least part of the first ground wiring, the second ground wiring, the signal wiring, and the third ground wiring is exposed through the at least partial region of the second insulating layer.

19. The flexible printed circuit board of claim 17, wherein at least part of the first ground wiring, the second ground wiring, the signal wiring and the third ground wiring is exposed through a region corresponding to the coupling part of the first insulating layer.

20. The flexible printed circuit board of claim 17, further comprising:
a first ground plane disposed on the first insulating layer; and
a second ground plane disposed on the third insulating layer, at least part of the third ground wiring is electrically connected to the second ground plane.

* * * * *